United States Patent
Kwon et al.

(10) Patent No.: US 9,337,105 B1
(45) Date of Patent: May 10, 2016

(54) METHODS FOR FABRICATING SEMICONDUCTOR DEVICES WITH WET ETCHING

(71) Applicant: Samsung Electronics Co., Ltd., Suwon-si, Gyeonggi-do (KR)

(72) Inventors: Yong-Bum Kwon, Yongin-Si (KR); Sung-Sam Lee, Yongin-Si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/732,884

(22) Filed: Jun. 8, 2015

(30) Foreign Application Priority Data

Dec. 3, 2014 (KR) ................ 10-2014-0172222

(51) Int. Cl.
| | |
|---|---|
| *H01L 21/00* | (2006.01) |
| *H01L 21/8234* | (2006.01) |
| *H01L 21/02* | (2006.01) |
| *H01L 21/762* | (2006.01) |
| *H01L 21/768* | (2006.01) |
| *H01L 21/311* | (2006.01) |
| *H01L 29/66* | (2006.01) |
| *H01L 27/108* | (2006.01) |

(52) U.S. Cl.
CPC .... *H01L 21/823475* (2013.01); *H01L 21/0214* (2013.01); *H01L 21/0217* (2013.01); *H01L 21/0228* (2013.01); *H01L 21/02164* (2013.01); *H01L 21/31111* (2013.01); *H01L 21/31144* (2013.01); *H01L 21/76224* (2013.01); *H01L 21/76879* (2013.01); *H01L 27/10897* (2013.01); *H01L 29/66515* (2013.01)

(58) Field of Classification Search
CPC .................. H01L 2924/1305; H01L 29/41766
See application file for complete search history.

(56) References Cited

U.S. PATENT DOCUMENTS

| | | | |
|---|---|---|---|
| 6,010,935 A | 1/2000 | Doan | |
| 6,171,954 B1 | 1/2001 | Hsu | |
| 7,018,781 B2 | 3/2006 | Fröhlich et al. | |
| 7,205,232 B2 | 4/2007 | Yun et al. | |
| 8,404,543 B2 | 3/2013 | Shin et al. | |
| 8,574,929 B1 * | 11/2013 | Or-Bach | H01L 27/0688 257/E21.568 |
| 8,987,028 B2 * | 3/2015 | Lochtefeld | H01L 21/02381 257/190 |
| 2009/0203190 A1 | 8/2009 | Noh et al. | |

FOREIGN PATENT DOCUMENTS

| | | |
|---|---|---|
| JP | 11-177089 | 7/1999 |
| KR | 1997-0052248 | 7/1997 |

(Continued)

*Primary Examiner* — Zandra Smith
*Assistant Examiner* — Andre' C Stevenson
(74) *Attorney, Agent, or Firm* — Myers Bigel & Sibley, P.A.

(57) ABSTRACT

A method for fabricating a semiconductor device is provided. The method for fabricating a semiconductor device includes forming transistors on a semiconductor substrate, each of the transistors having a gate structure and source/drain regions, forming an oxide film on the transistors, forming a mask film pattern on the oxide film, the mask film pattern comprising a first pattern having a first width and a second pattern having a second width different from the first width, removing a part of the oxide film using the mask film pattern to form first and second trenches, filling the first and second trenches with a nitride film, removing the rest part of the oxide film to form third and fourth trenches, and forming conductive contacts by filling the third and fourth trenches. A top width of each of the third trenches is equal to the first width, and a top width of each of the fourth trenches is equal to the second width.

15 Claims, 26 Drawing Sheets

(56) References Cited

FOREIGN PATENT DOCUMENTS

| KR | 1998-084290 | 12/1998 |
| KR | 10 2003-0001851 A | 1/2003 |
| KR | 10 2005-0122075 A | 12/2005 |
| KR | 10 2009-0110568 A | 1/2009 |
| KR | 10 2010-0079916 A | 7/2010 |

* cited by examiner

1200

1300

1400

METHODS FOR FABRICATING SEMICONDUCTOR DEVICES WITH WET ETCHING

CROSS-REFERENCE TO RELATED APPLICATIONS

This application claims the priority of Korean Patent Application No. 10-2014-0172222 filed on Dec. 3, 2014, in the Korean Intellectual Property Office, the disclosure of which is incorporated herein by reference.

TECHNICAL FIELD

The present disclosure relates to a semiconductor device and a method for fabricating the same.

DESCRIPTION OF THE RELATED ART

Recently, as semiconductor devices are highly integrated, the SAC (Self-Aligned Contact) process is employed for forming contact holes. In the existing SAC processes, misalignment may occur due to a ratio of etch rates (etch selectivity) between film materials. To address this issue, a variety of researches into methods for forming contacts are on-going.

SUMMARY

An aspect of the present disclosure is to provide a semiconductor device with improved reliability.

Another aspect of the present disclosure is to provide a method for fabricating a semiconductor device with improved reliability.

According to an aspect of the present disclosure, a method is provided for fabricating a semiconductor device, the method includes forming transistors on a semiconductor substrate, each of the transistors having a gate structure and source/drain regions, forming an oxide film over on the transistors, and forming a mask film pattern on the oxide film. The mask film pattern includes a first pattern having a first width and a second pattern having a second width different from the first width, removing a part of the oxide film using the mask film pattern to form first and second trenches, filling the first and second trenches with a nitride film, removing the rest part of the oxide film to form third and fourth trenches, and forming conductive contacts by filling the third and fourth trenches. A top width of each of the third trenches may be equal to the first width, and a top width of each of the fourth trenches may be equal to the second width.

According to an aspect of the present disclosure, a method is provided for fabricating a semiconductor device. The method
includes forming transistors on a semiconductor substrate, each of the transistors having a gate structure and source/drain regions, depositing a first insulating film over the transistors, forming a mask film pattern on the first insulating film, forming first trenches in the first insulating film using the mask film pattern, each of the first trenches having a bottom width smaller than a top width, filling the first trenches with a second insulating film including a different material from the first insulating film, removing the first insulating film to form second trenches, and forming conductive contacts by filling the second trenches, each of the conductive contacts having a bottom width larger than a top width thereof.

According to an aspect of the present disclosure, a method is provided for fabricating a semiconductor device. The method may include forming a plurality of channel regions protruding from a semiconductor substrate, forming a plurality of transistors each comprising a gate structure and source/drain region. A respective one of the plurality of transistors may be formed on a respective one of the plurality of channel regions. The method may include depositing a first insulating film over the transistors, forming a mask film pattern on the first insulating film, and forming a first trench using a first isotropic etching of the first insulating film of the first insulating film using the mask film pattern. The first trench may have a first bottom width smaller than a first top width. The method may include filling the first trench with a second insulating film including a different material from the first insulating film, removing the first insulating film to form a second trench, and forming a conductive contact in the second trench.

In some embodiments, a respective one of the plurality of channel regions may include a fin structure. The conductive contact may be formed on the fin structure. A middle width of a middle portion of the second trench may be less than a second bottom width and a second top width of the second trench. In some embodiments, the second bottom width may be greater than the second top width. The second isotropic etching may include removing the first insulating film based on the etch selectivity between the first insulating film and the second insulating film.

These and other aspects, embodiments and advantages of the present disclosure will become immediately apparent to those of ordinary skill in the art upon review of the Detailed Description and Claims to follow.

It is noted that aspects of the disclosure described with respect to one embodiment, may be incorporated in a different embodiment although not specifically described relative thereto. That is, all embodiments and/or features of any embodiment may be combined in any way and/or combination. These and other objects and/or aspects of the present invention are explained in detail in the specification set forth below.

BRIEF DESCRIPTION OF THE DRAWINGS

The above and other aspects, features and other advantages of the present disclosure will be more clearly understood from the following detailed description taken in conjunction with the accompanying drawings. The drawings are not necessarily to scale, emphasis instead being placed upon illustrating the principles of the inventive disclosure. In the drawings.

DETAILED DESCRIPTION

Figure 1:
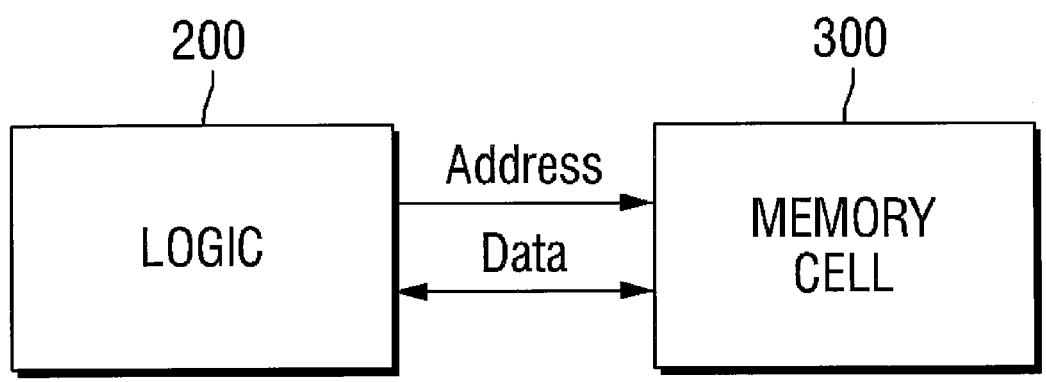
FIG. 1 is a block diagram of a semiconductor device according to some embodiments of the present disclosure.

The present disclosure will now be described more fully hereinafter with reference to the accompanying drawings, in which example embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions may be exaggerated for clarity.

It will also be understood that when a layer is referred to as being "on" another layer or substrate, it may be directly on the other layer or substrate, or intervening layers may also be present. In contrast, when an element is referred to as being "directly on" another element, there are no intervening elements present.

Spatially relative terms, such as "beneath," "below," "lower," "above," "upper", "opposite" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or terms provided herein is intended merely to better illuminate the invention and is not a limitation on the scope of the invention unless otherwise specified. Further, unless defined otherwise, all terms defined in generally used dictionaries may not be overly interpreted.

The present disclosure will be described with reference to perspective views, cross-sectional views, and/or plan views, in which preferred embodiments of the invention are shown. Thus, the profile of a view may be modified according to manufacturing techniques and/or allowances. That is, the embodiments of the invention are not intended to limit the scope of the present disclosure but cover all changes and modifications that may be caused due to a change in manufacturing process. Thus, regions shown in the drawings are illustrated in schematic form and the shapes of the regions are presented simply by way of illustration and not as a limitation.

FIG. 1 is a block diagram of a semiconductor device according to some embodiments of the present disclosure.

Referring to FIG. 1, the semiconductor device may include a logic region 200 and a memory cell 300.

The memory cell 300 may have memory elements to store data therein. In some embodiments of the present disclosure, the memory cell 300 may include, but is not limited to, a DRAM (Dynamic Random Access Memory) cell, for example.

According to some embodiments of the present disclosure, the memory cell 300 may include other memories, such as an MRAM (Magnetoresistive Random Access Memory) and a PRAM (Phase-change Random Access Memory).

In the logic region 200, a plurality of semiconductor elements may be formed. The plurality of semiconductor elements may be used to receive data read out from the memory cell 300 or to provide data to be written into the memory cell 300. Examples of the semiconductor elements may include, but are not limited to, an inverter, a pre-charger, etc. The logic region 200 may provide an address to the memory cell 300 to access the contents therein. In some embodiments, data may be exchanged between the logic region 200 and the memory cell 300.

Figure 2:
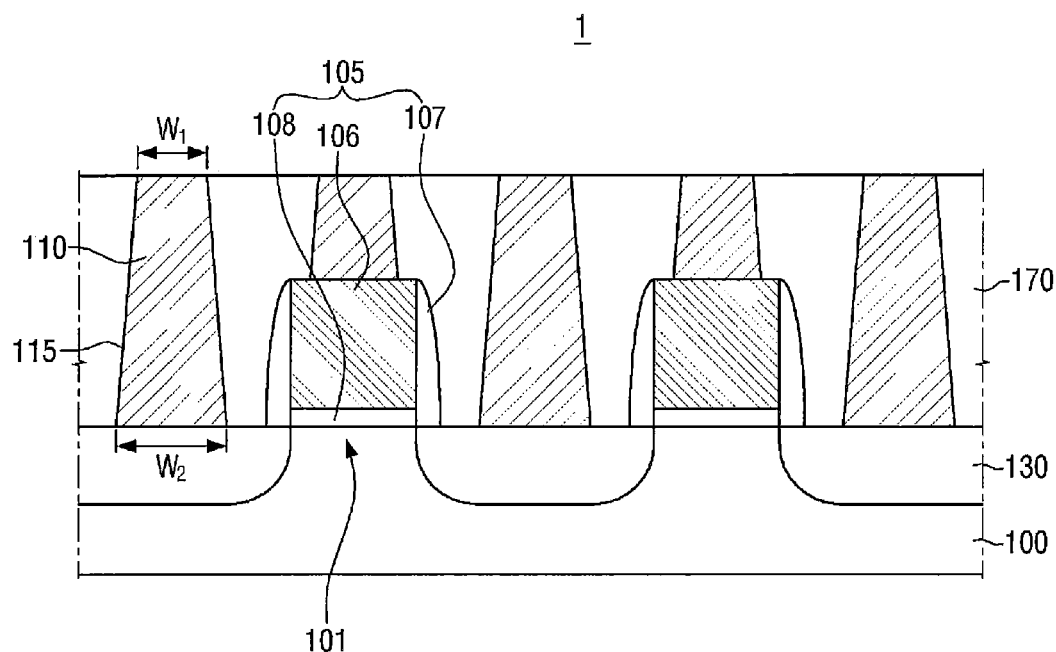
FIG. 2 is a cross-sectional view of the logic region of FIG. 1.

FIG. 2 is a cross-sectional view of the logic region of FIG. 1.

Referring to FIG. 2, the logic region of the semiconductor device 1 includes a semiconductor substrate 100, transistors 101, conductive contacts 110, and an interlayer insulation layer 170.

The semiconductor substrate 100 of semiconductor device 1 may be either a bulk silicon substrate or a SOI (silicon-on-insulator) substrate. In some embodiments, the semiconductor substrate 100 may be a silicon substrate or may be a substrate made of other materials, such as silicon germanium (SiGe), indium antimonide (InSb), lead-telluride (PbTe) compound, indium arsenide (InAs), indium phosphide (InP), gallium arsenide (GaAs) and gallium antimonide (GaSb).

Each of the transistors 101 may include a gate structure 105 and source/drain regions 130.

As shown in FIG. 2, the source/drain regions 130 may be formed on at least one side of the gate structure 105. Additionally, each of the source/drain regions 130 may be formed in the substrate 100 between adjacent gate structures 105.

According to some embodiments, if an active layer is formed on the semiconductor substrate 100 by an epitaxial growth process, for example, the source/drain regions 130 may be formed inside the active layer.

The source/drain regions 130 are formed in the semiconductor substrate 100 in FIG. 1, for example. In some embodiments of the present disclosure, the source/drain regions 130 may be grown by an epitaxial growth process so that the upper surface of each of the source/drain regions 130 is higher than the upper surface of the semiconductor substrate 100.

The source/drain regions 130 may include, for example, silicon or germanium, which are single-element semiconductor materials. In addition, the source/drain regions 130 may include compound semiconductor, such as IV-IV group compound semiconductor or III-V group compound semiconductor.

Although not shown in FIG. 2, the source/drain regions 130 may be formed in an LDD (Lightly-Doped Drain) structure.

Each of the gate structures 105 may include a gate electrode 106, spacers 107, and a gate insulating film 108.

The gate electrode 106 may include a conductive material, for example. Examples of such a conductive material may include, but are not limited to, doped polysilicon, titanium nitride (TiN), tantalum nitride (TaN), tungsten nitride (WN), titanium (Ti), tantalum (Ta), tungsten (W), etc.

The gate insulating film 108 may be disposed between the semiconductor substrate 100 and the gate electrode 106.

In some embodiments of the present disclosure, the gate insulating film 108 may include a high-K material, for example.

The high-K material may include, but is not limited to, hafnium oxide, hafnium silicon oxide, lanthanum oxide, lanthanum aluminum oxide, etc.

The spacers 107 may be disposed on at least one side of each of the gate structures 105. Specifically, the spacers 107 may be disposed on either side surface of the gate electrode 106, as shown in FIG. 2. The spacers 107 may include, but are not limited to, silicon nitride (SiN) or silicon oxycarbonitride (SiOCN), for example.

The interlayer insulating film 170 may be formed on the semiconductor substrate 100. Specifically, the interlayer insulating film 170 may by formed so that it covers the transistors 101 formed on the semiconductor substrate 100, as shown in FIG. 2.

In some embodiments of the present disclosure, the interlayer insulating film 170 may include a nitride film. Specifically, the interlayer insulating film 170 may include, but are not limited to, a silicon nitride (SiN) film or silicon oxycarbonitride (SiOCN) film.

According to some embodiments, in the interlayer insulating film 170, trenches 115 may be formed, each having the top width w1 smaller than the bottom width $w_2$. The trenches 115 according some embodiments are so shaped, because the methods for fabricating a semiconductor device according to the embodiments of the present disclosure employ reverse patterning that forms mask films on positions where contacts are to be formed, unlike typical methods for forming a contact. Detailed descriptions on this will be given later on.

The conductive contacts 110 may be formed on the source/drain regions 130 or on the gate electrodes 106, so that the trenches 115 are filled with the conductive contacts 110. The conductive contacts 110 may electrically connect the source/drain regions 130 or the gate electrodes 106 with other semiconductor elements (e.g., metal wiring) formed thereon.

According to some embodiments of the present disclosure, the bottom width $w_2$ of each of the conductive contacts 110 may be larger than the top width $w_1$. For a wet etching process, as the etching process proceeds, the amount of material dissolved by an etchant reduces with the depth of a contact hole, so that the bottom width of the contact hole may be smaller than the top width (i.e., w1>w2).

In contrast, the conductive contacts 110 according to some embodiments are formed to have the width $w_2$ of the bottom larger than the width w1 of the top, so that open-circuit failure possibly occurring at the bottom of any of the conductive contacts 110 may be prevented. Consequently, reliability of a semiconductor device including the conductive contacts 110 may be improved.

The conductive contacts 110 may include a conductive material. In some embodiments of the present disclosure, such a conductive material may include, but is not limited to, at least one of: polycrystalline silicon, metal-silicide compound, conductive metal nitride and metal.

As will be described below, methods for fabricating a semiconductor device according to some embodiments of the present disclosure employ a reverse patterning scheme, in which a mask pattern is formed on positions where the conductive contacts 110 are to be formed. This provides a benefit in that an operator may form the conductive contacts 110 in a desired shape.

Consequently, the conductive contacts 100 in the logic region 200 (in FIG. 1), which are in a complicated pattern unlike those in the memory cell 300 (FIG. 1), also may be formed reliably.

Additionally, during an etching process for forming the conductive contacts 110, open-circuit failure possibly occurring in the conductive contacts 110 may be prevented, thereby eliminating defects in a semiconductor device. As a result, reliability of the semiconductor device may be improved.

Figure 3:
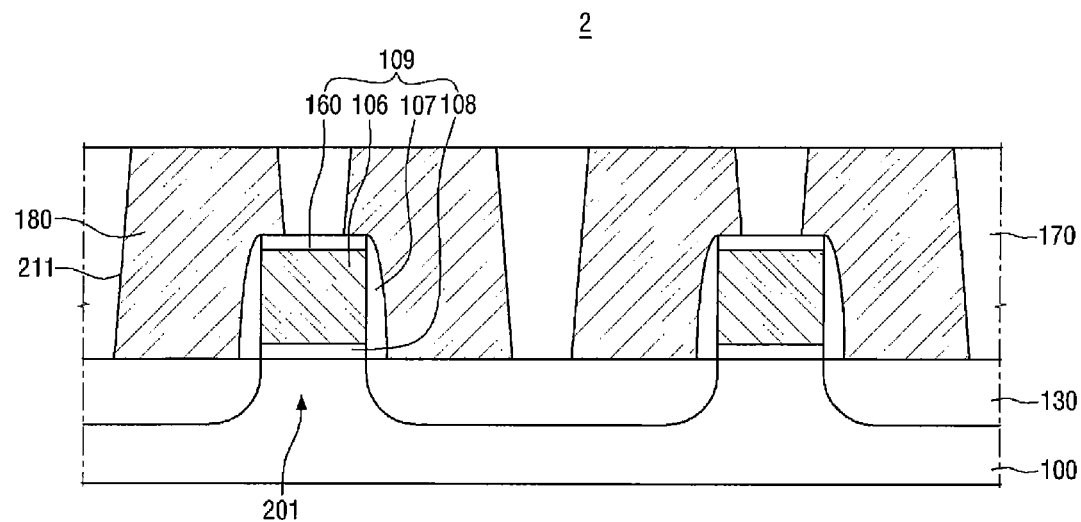
FIG. 3 is a diagram for illustrating a semiconductor device according to some embodiments of the present disclosure.

FIG. 3 is a diagram illustrating a semiconductor device according to embodiments of the present disclosure. In the following descriptions, descriptions will be made focusing on differences from other embodiments, and the redundant description will be omitted.

Referring to FIG. 3, a semiconductor device 2 may include self-aligned contacts 180 formed on the transistors 201 and protective films 160 formed on gate electrodes 106.

An interlayer film 170 may be formed so that it covers the gate structures 109 while exposing source/drain regions 130.

To form the self-aligned contacts 180, the trenches 211 formed in the interlayer film 170 may have at least a part of the upper surface of each of the source/drain regions 130 exposed.

The self-aligned contacts 180 may be formed by filling the trenches 211 with a conductive material.

Each of the protective films 160 may be formed on the respective gate electrodes 106. Specifically, each of the protective films 160 may be formed on and aligned with the respective gate electrodes 106, as shown in FIG. 3.

The protective films 160 may include an insulative material. In some embodiments of the present disclosure, the protective films 160 may include, but are not limited to, a silicon nitride (SiN) film.

The protective films 160 including an insulative material may prevent the self-aligned contacts 180 from being electrically connected to the gate electrodes 106 during the process of forming the self-aligned contacts 180. Accordingly, the self-aligned contacts 180 may be electrically connected to the source/drain regions 130 formed on either side of the gate electrodes 106 but may not be electrically connected to the gate electrodes 106.

Figure 4:
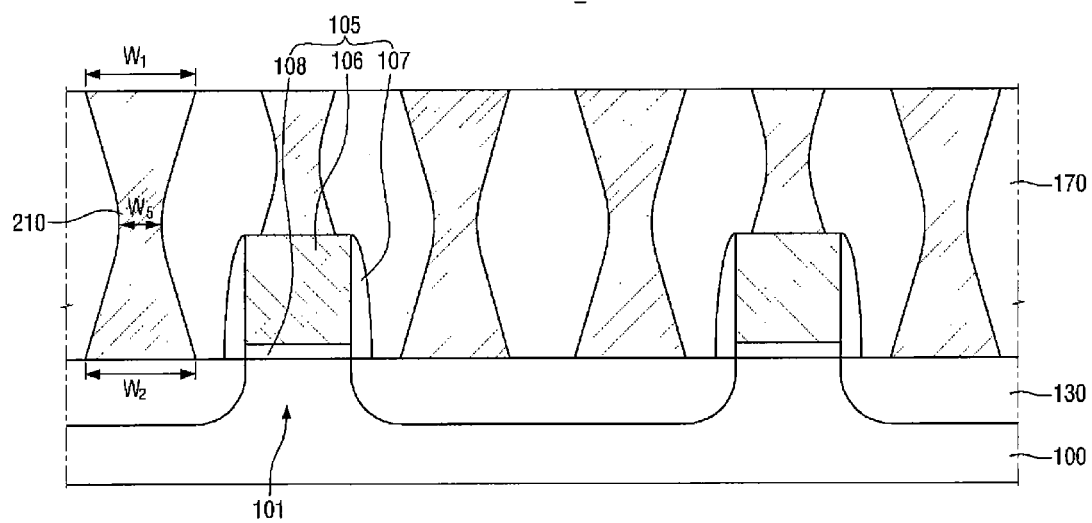
FIG. 4 is a diagram for illustrating a semiconductor device according to some embodiments of the present disclosure.

FIG. 4 is a diagram illustrating a semiconductor device according to embodiments of the present disclosure. In the following descriptions, descriptions will be made focusing on differences from the above embodiments, and the redundant description will be omitted.

Referring to FIG. 4, a semiconductor device 3, according to embodiments of the present disclosure, is different from the above embodiments in the shape of conductive contacts 210.

Specifically, the middle width w5 of each of the conductive contacts 210 may be smaller than the top width w1 thereof.

Further, the middle width w5 of each of the conductive contacts 210 may be smaller than the bottom width w2 thereof.

More specifically, the top width $w_1$ and the bottom width $w_2$ of each of the conductive contacts 210 may be substantially equal to each other but may be larger than the middle width w5 thereof.

With this shape, the contact area of the tops of the conductive contacts 210 is increased, so that semiconductor elements (e.g., wiring) to be formed on the conductive contacts 210 may have better electrical connectivity with the conductive contacts 210. Additionally, defects in a semiconductor device caused by open-circuit failure in a contact may be reduced.

FIGS. 5 to 11 are cross-sectional views for illustrating processes of a method for fabricating a semiconductor device according to embodiments of the present disclosure.

Figure 5:
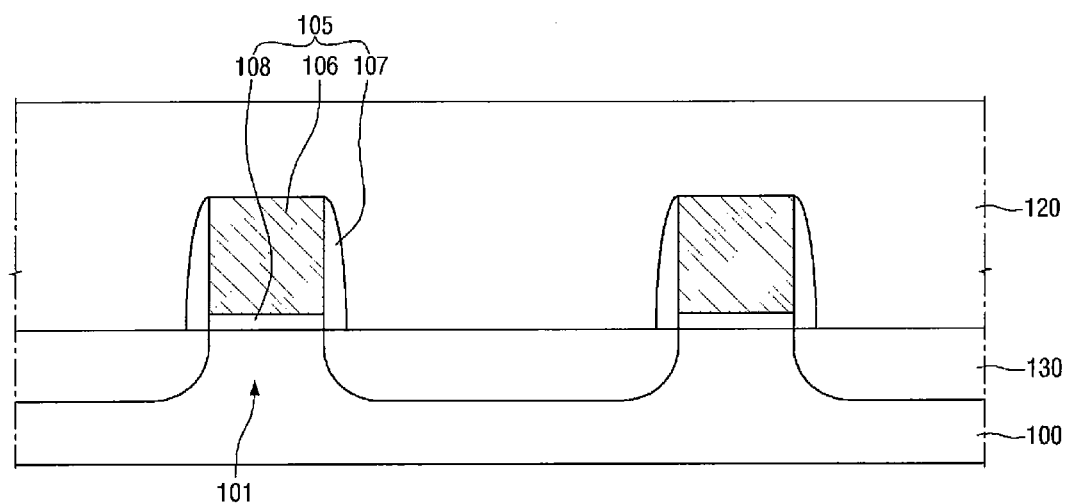
FIGS. 5 to 11 are cross-sectional views for illustrating processes of a method for fabricating a semiconductor device according to some embodiments of the present disclosure.

Referring to FIG. 5, transistors 101 are formed on a semiconductor substrate 100.

Specifically, an insulative material and a conductive material may be applied on the semiconductor substrate 100. Then, the insulative material and the conductive material applied on the semiconductor substrate 100 are patterned so as to form gate insulating films 108 and gate electrodes 106.

Subsequently, impurity is doped into the semiconductor substrate 100 using the gate electrodes 106 as a mask, to thereby form source/drain regions 130 on either side of each of the gate electrodes 106.

Subsequently, an insulating film may be formed to cover the gate electrodes 106, and spacers 107 are formed on either side of each of the gate electrodes 106 by etching the insulating film.

Subsequently, a first insulating film 120 may be deposited over the transistors 101.

According to some embodiments, the first insulating film 120 may include an oxide film, for example. Specifically, the first insulating film 120 may include silicon oxide ($SiO_2$) film, for example.

The first insulating film 120 may be deposited so that it completely covers the transistors 101, as shown FIG. 5.

The first insulating film 120 may be deposited by a CVD (Chemical Vapor Deposition) method, a PECVD (Plasma Enhanced CVD) method, etc., so that it is conformal to the shape of the transistors 101.

Depositing the first insulating film 120 often requires applying upper and lower photoresists in the first insulating film 120. However, the method for fabricating a semiconductor device according to some embodiments of the present disclosure does not require such an additional process.

Accordingly, a step of applying a lower photoresist on the semiconductor substrate 100, and a step of sequentially applying an oxide film and an upper photoresist on the lower photoresist may be not necessary. As a result, fabricating processes may be shortened for the semiconductor devices having the same structure.

Figure 6:
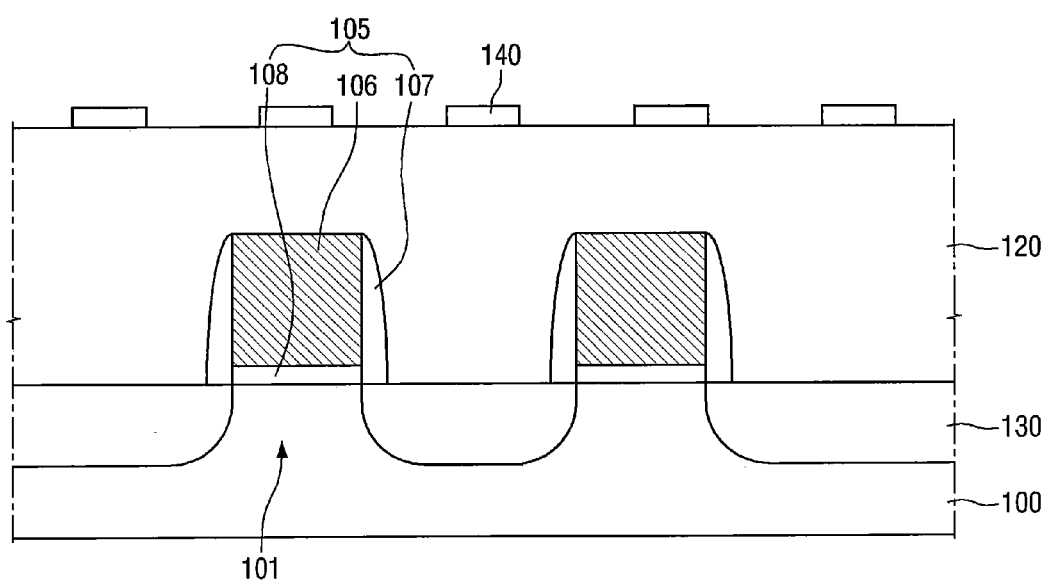

Referring to FIG. 6, a mask film pattern 140 may be formed above the gate electrode 106 and on the first insulating film 120.

In some embodiments of the present disclosure, the mask film pattern 140 may be made of a hard film material and may be made of the same material as the spacers 107. Specifically, the mask film pattern 140 may include, but are not limited to, silicon nitride (SiN) film, for example.

According to some embodiments, the mask film pattern 140 may be formed at positions where the conductive contacts 110 (in FIG. 11) are to be formed. In other words, according to some embodiments, the mask film pattern 140 may be formed where the conductive contacts 110 (in FIG. 11) are to be formed, rather than all area excluding where the conductive contacts are to be formed.

Figure 7:
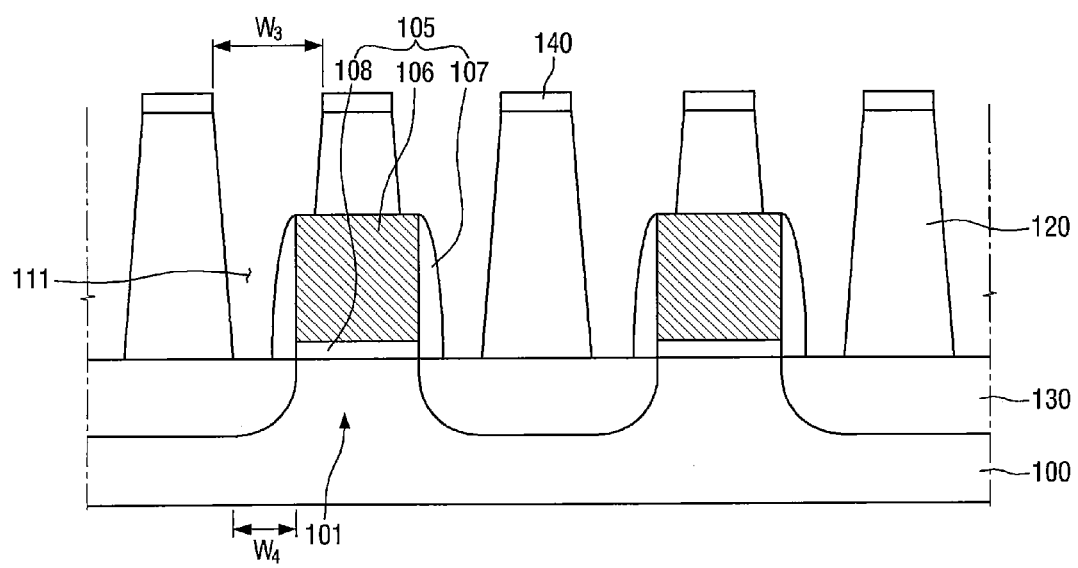

Further, as will be described below, when forming first trenches 111 (in FIG. 7) next to positions where conductive contacts 110 (in FIG. 11) are to be formed, each of the first trenches 111 (in FIG. 7) may have the top width w3 (in FIG. 7) larger than the bottom width w4 (in FIG. 7). The first insulating film 120 may be etched by using, as a mask, a second insulating film 150 (in FIG. 8) with which the first trenches 111 (in FIG. 7) are filled.

By doing so, the bottom width w2 (in FIG. 2) of each of the conductive contacts 110 may be larger than the top width w1 (in FIG. 2) thereof. Accordingly, open-circuit failure possibly occurring in a contact during the processes of forming the conductive contacts 110 may be prevented. Consequently, reliability of a semiconductor device may be improved.

Subsequently, referring to FIG. 7, the first trenches 111 are formed in the first insulating film 120 using the mask film pattern 140. In doing so, the first trenches 111 may be formed by using isotropic etching, for example. Specifically, forming the first trenches 111 may involve, but is not limited to, performing wet etching on the first insulating film 120 using a solution containing HF and $NH_4F$ as an etchant, for example.

In some embodiments of the present disclosure, when an etching process is performed for forming the first trenches 111, the amount of material dissolved by an etchant reduces with the depth of the first trenches 111. Accordingly, the width of each of the first trenches 111 may become narrower toward their respective bottoms, so that the bottom width $w_4$ of each of the first trenches 111 may be smaller than the top width $w_3$ thereof.

Figure 8:
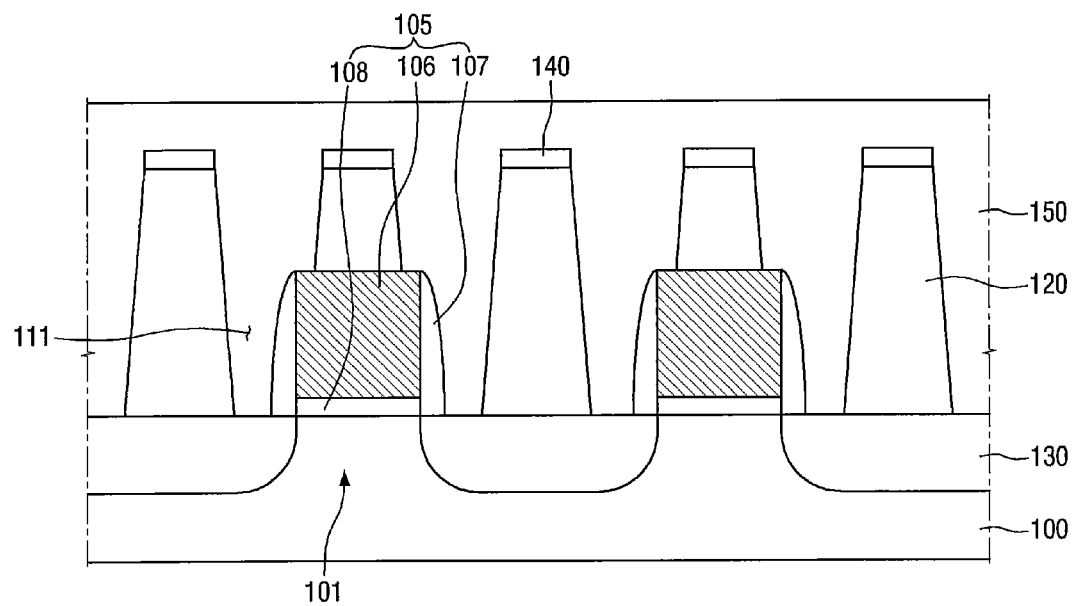

Referring to FIG. 8, the first trenches 111 may be filled with the second insulating film 150. Specifically, the second insulating film 150 may be deposited so that it covers the first trenches 111 and the gate structures 105.

In some embodiments of the present disclosure, filling the first trenches 111 with the second insulating film 150 may include, but is not limited to, filling the first trenches 111 with the second insulating film 150 by using the ALD (Atomic Layer Deposition) technique.

As such, according to some embodiments, by employing the ALD technique in the process of filling the first trenches 111 with the second insulating film 150, it is possible to solve the problem that the first trenches 111 become narrower toward their bottoms so that the first trenches 111 are not uniformly filled with the second insulating film 150.

In some embodiments of the present disclosure, the second insulating film 150 may include a nitride film, for example. Specifically, the second insulating film 150 may include, but is not limited to, a silicon oxycarbonitride (SiOCN) film, for example.

Figure 9:
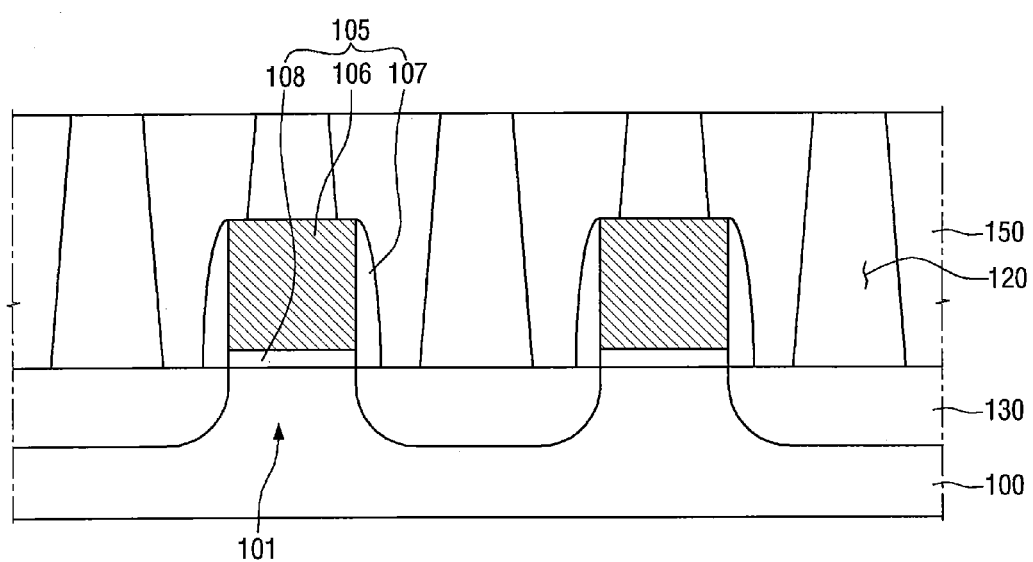

Referring to FIG. 9, upper surfaces of the first insulating film 120 are exposed, for example, by a planarization process. The planarization process may include a CMP (Chemical-Mechanical Planarization) process, for example.

In some embodiments of the present disclosure, a part of the second insulating film 150 covering the first insulating film 120 may be removed together with the mask film pattern 140 (in FIG. 8) via the planarization process.

Figure 10:
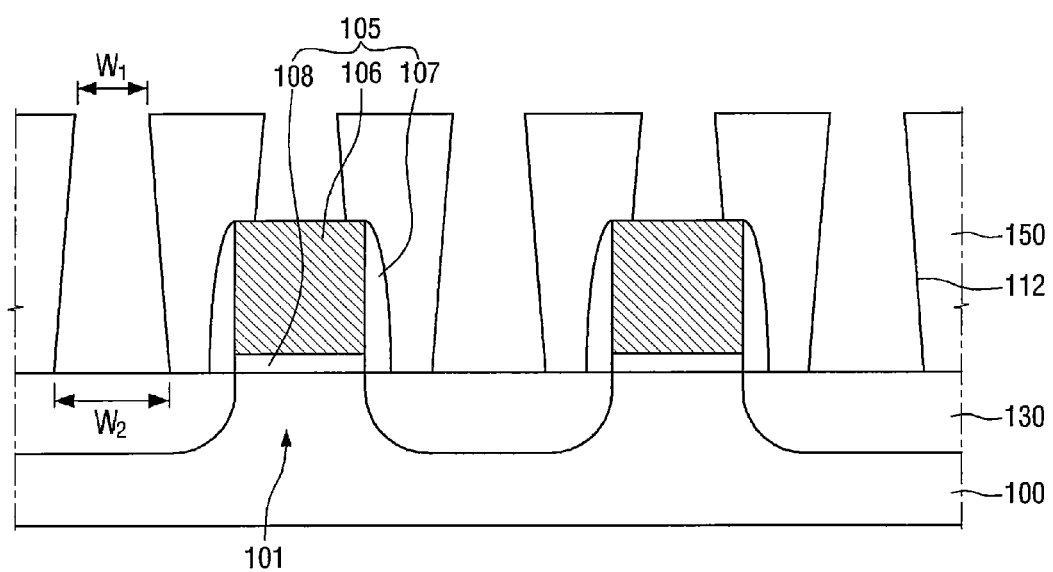

Referring to FIG. 10, the first insulating film 120 (in FIG. 9) is removed to form second trenches 112.

Removing the first insulating film 120 (in FIG. 9) may be performed by making use of the etch selectivity between the first insulating film 120 (in FIG. 9) and the second insulating film 150. Specifically, by using an etchant having etch selectivity of the first insulating film 120 (in FIG. 9) relative to the second insulating film 150, the first insulating film 120 (in FIG. 9) may be removed.

In some embodiments of the present disclosure, the first insulating film 120 may be removed using the second insulating film 150 as a mask, to form the second trenches 112. In doing so, the second trenches 112 may be formed by using isotropic etching, for example.

Specifically, such an etching process may be performed by using an etchant such as BOE (Buffered Oxide Etchant). Such BOE may include, but is not limited to, HF and $NH_4F$, for example.

By forming the second trenches 112 in this manner, a part of the upper surface of each of the source/drain regions 130 may be exposed, as shown in FIG. 10.

The top width w3 (in FIG. 7) of each of the first trenches 111 (in FIG. 7) formed next to the respective second trenches may be larger than the bottom width w4 (in FIG. 7) of the bottom thereof. In addition, the first insulating film 120 may be etched by using, as a mask, the second insulating film 150 (in FIG. 9) with which the first trenches 111 (in FIG. 7) are filled. Consequently, the bottom width w2 of each of the second trenches 112 may be larger than the top width w1 thereof.

Figure 11:
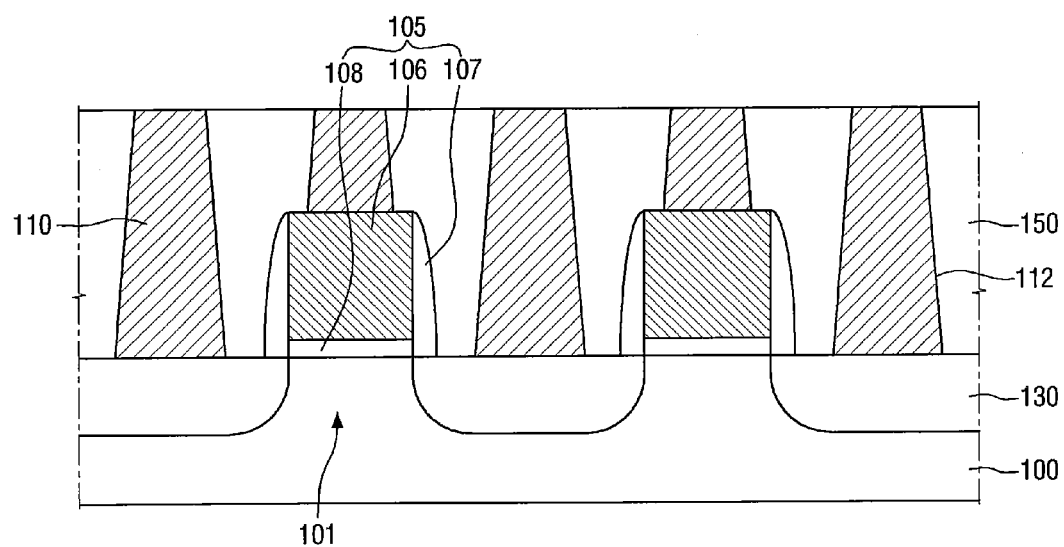

Referring to FIG. 11, conductive contacts 110 are formed in the second trenches 112. The conductive contacts 110 may include a conductive material.

For example, the conductive material may include, but is not limited to, at least one of: polycrystalline silicon, metal-silicide compound, conductive metal nitride and metal.

Figure 12:
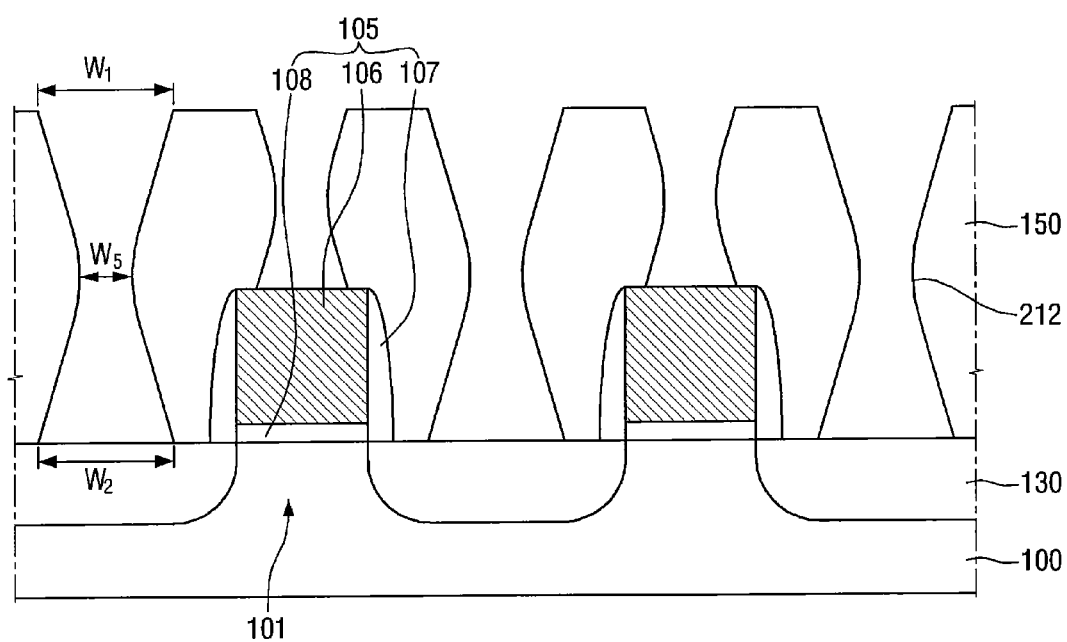
FIG. 12 is a diagram for illustrating a method for fabricating a semiconductor device according to some embodiments of the present disclosure.

FIG. 12 is a diagram for illustrating a method for fabricating a semiconductor device according to some embodiments of the present disclosure. In the following descriptions, descriptions will be made focusing on differences from the above embodiments, and the redundant description will be omitted.

Initially, the fabricating processes described above with respect to FIGS. 5 to 9 may be performed.

Subsequently, referring to FIG. 12, the first insulating film 120 (in FIG. 8) is removed to form the second trenches 212.

According to some embodiments, during the process of forming the second trenches 212, parts of upper portions of the second insulating film 150 may also be etched as shown in FIG. 12.

This may occur since some portions of the second insulating film 150 may be etched when the etchant flows into upper portion thereof during the process of removing the first insulating film 120 (in FIG. 8), regardless of the etch selectivity between the first insulating film 120 (in FIG. 8) and the second insulating film 150.

Consequently, the top width w1 of each of the second trenches 212, as well as the bottom width w2 thereof, may be larger than the middle width w5 thereof.

Subsequently, the second trenches 212 are filled with the conductive contacts 210 (in FIG. 4).

By forming the conductive contacts 210 (in FIG. 4) in this manner, the contact area of the tops of the conductive contacts 210 (in FIG. 4) may be increased.

With the increased contact area, electrical connectivity with semiconductor elements to be formed on the conductive contacts 210 (in FIG. 4) may be further improved, and defects in a semiconductor device caused by bad contact between the contacts and the elements may be prevented. As a result, reliability of the semiconductor device may be improved.

Figure 13:
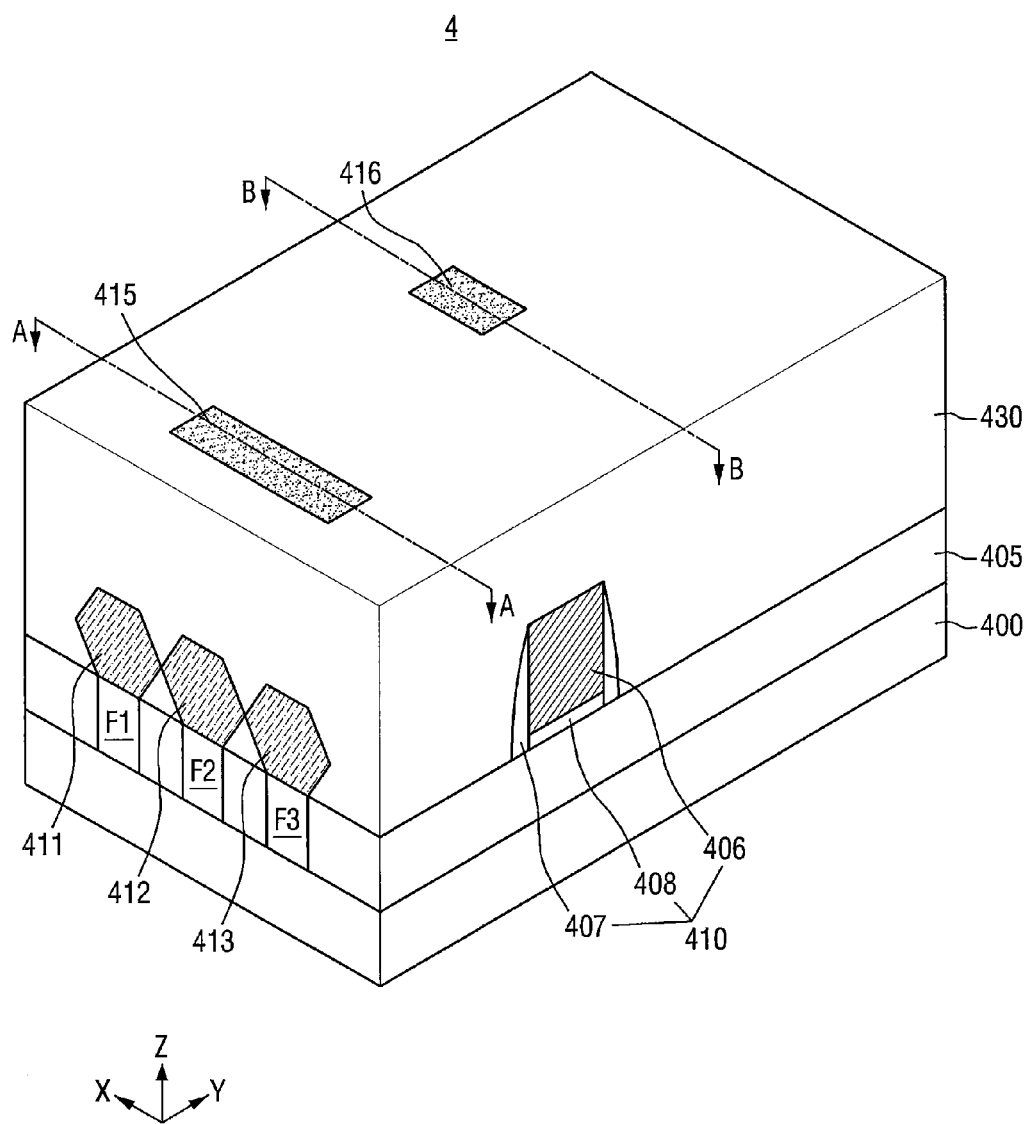
FIG. 13 is a perspective view of a semiconductor device according to some embodiments of the present disclosure.
Figure 14:
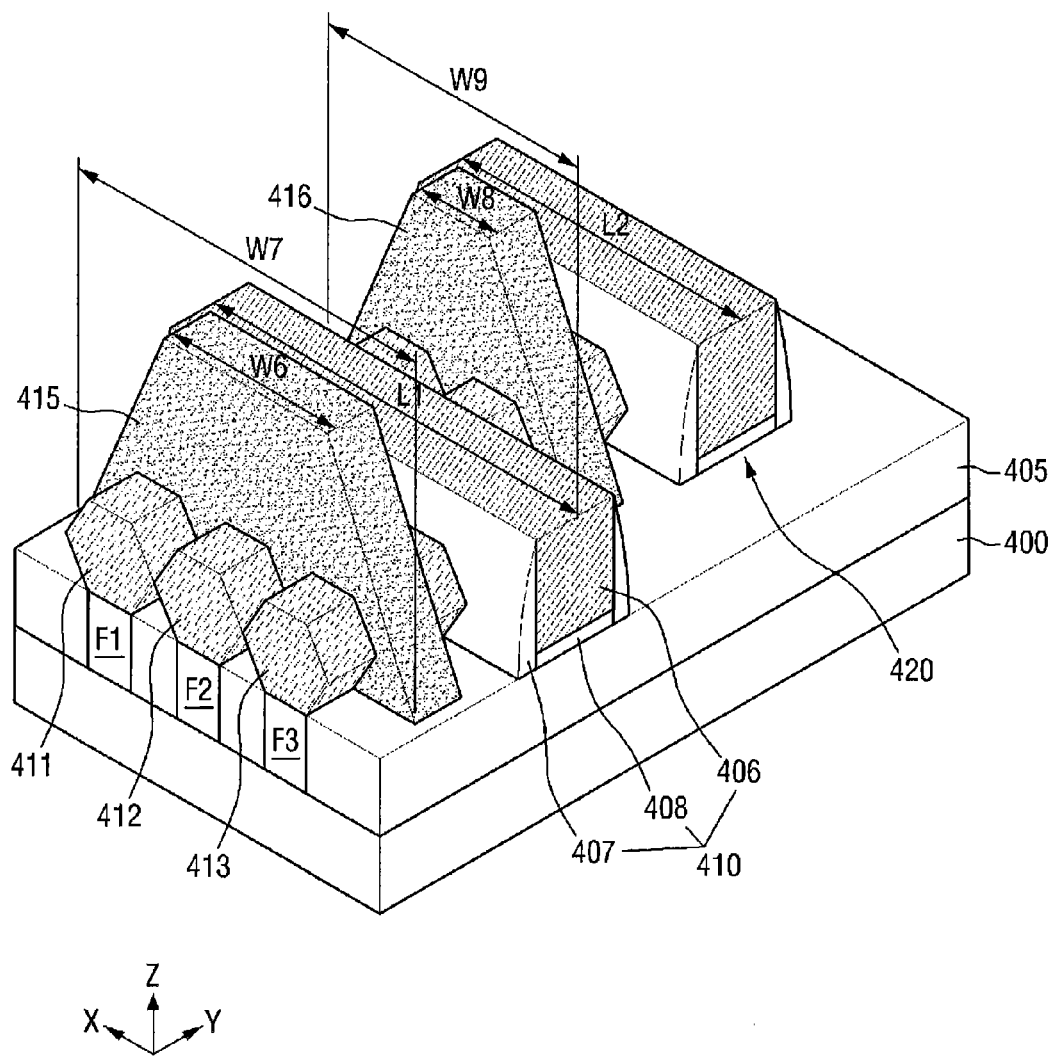
FIG. 14 is a partial perspective view of the semiconductor device shown in FIG. 13.

FIG. 13 is a perspective view of a semiconductor device according to some embodiments of the present disclosure. FIG. 14 is a partial perspective view of the semiconductor device shown in FIG. 13. For brevity, descriptions will be made focusing on differences from the above embodiments and the redundant description will be omitted.

Referring to FIG. 13, a semiconductor device 4 according to some embodiments is of a fin-type semiconductor device. In FIG. 14, the interlayer insulating film 430 (in FIG. 13) has been removed from the semiconductor device 4 shown in FIG. 13.

Specifically, the semiconductor device 4 may include a substrate 400, a field insulating film 405, a first gate structure 410, a second gate structure 420, first to third fins F1 to F3, first to third source/drain regions 411 to 413, an interlayer insulating film 430, first and second conductive contacts 415 and 416, etc.

The substrate 400 may be substantially identical to the substrate 100 (in FIG. 2) of the semiconductor device 1 according to some embodiments of the present disclosure.

The field insulating film 405 may be formed on the substrate 400. The field insulating film 405 may be, but is not limited to, a HDP oxide film, a SOG oxide film or a CVD oxide film, for example. The field insulating film 405 may be used for separation of elements.

The first to third fins F1 to F3 may be formed on the substrate 400. For example, the first to third fins F1 to F3 may protrude from the substrate 400. Specifically, the first to third fins F1 to F3 may protrude from the substrate 400 in a third (z-axis) direction.

The first to third fins F1 to F3 may be extended in a second (y-axis) direction. Specifically, each of the first to third fins F1 to F3 may have a longer side and a shorter side, so that each of the first to third fins F1 to F3 is extended along the longer side. The first to third fins F1 to F3 may be formed adjacent to one another. For the purpose of illustration, in FIG. 14, the longer side extends in the second (y-axis) direction while the shorter side extends in the first (x-axis) direction. As another example, the longer side of each the first to third fins F1 to F3 may extend in the first (x-axis) direction while the shorter side thereof may extend in the second (y-axis) direction.

The first to third fins F1 to F3 may be a part of the substrate 400 and may include an epitaxial layer which has been grown on the substrate 400.

The first gate structure 410 may be formed so that it intersects the first to third fins F1 to F3. The first gate structure 410 may include a gate electrode 406, spacers 407, and a gate insulating film 408.

The gate electrode 406, the spacers 407, and the gate insulating film 408 of the first gate structure 410 may be substantially identical to the gate electrode 106 (in FIG. 2), the spacers 107 (in FIG. 2), and the gate insulating film 108 (in FIG. 2) of the semiconductor device 1, respectively.

The second gate structure 420 may be substantially identical to the first gate structure 410 except for the length L1 of the first gate structure 410 in the first (x-axis) direction.

The second gate structure 420 may intersect the first and second fins F1 and F2. In FIG. 14, the length L2 of the second gate structure 420 in the first (x-axis) direction is shorter than the length L1 of the first gate structure 410 in the first (x-axis) direction. However, it is merely illustrative. Namely, the length L1 of the first gate structure 410 in the first (x-axis) direction may be shorter than the length L2 of the second gate structure 420 in the first (x-axis) direction, as necessary.

The spacers 407 may be disposed on at least one side of each of the first and second gate structures 410 and 420. Although the spacers 407 have sloping sidewalls in FIG. 14, it is merely illustrative. That is, the spacers 407 may have vertical sidewalls.

The first to third source/drain regions 411 to 413 may be formed on at least one side of the first gate structure 410 and on the first to third fins F1 to F3, respectively. The first to third source/drain regions 411 to 413 may be insulated from the first gate structure 410 by the spacers 407.

As shown in FIGS. 13 and 14, a cross-section of the first to third source/drain regions 411 to 413 may have, but are not limited to, a hexagonal shape. Namely, the first to third source/drain regions 411 to 413 may have a diamond shape, a circular shape, a rectangular shape, etc.

As may be seen from FIG. 14, the third source/drain region 413 may be disposed only on one side of the first gate structure 410. However, it is merely illustrative. For example, if the length L2 of the second gate structure 420 in the first (x-axis) direction is equal to the length L1 of the first gate structure 410 in the first (x-axis) direction, the third source/drain region 413 may be disposed on either side of the first gate structure 410 so as to connect the first gate structure 410 to the second gate structure 420.

Although the first to third source/drain regions 411 to 413 are shown as being adjacent to one another, it is merely illustrative. Namely, the first to third source/drain regions 411 to 413 may be distant from one another and/or spaced apart.

If the semiconductor device 4 is an NMOS transistor, the first to third source/drain regions 411 to 413 may include the same material as the substrate 400 or may include a tensile-stressed material. For example, if the substrate 400 is made of Si, the first to third source/drain regions 411 to 413 may include Si or a material having a lattice constant smaller than that of Si (e.g., SiC, SiP, etc.). With the tensile-stressed material, when tensile stress is exerted to the first to third fins F1 to F3 (i.e., channel regions) below the first gate structure 410, the mobility of carriers in the channel regions may be improved.

On the other hand, if the semiconductor device 4 is a PMOS transistor, first to third source/drain regions 411 to 413 may include a compressive-stressed material. For example, the compressive-stressed material may be a material having a lattice constant larger than that of Si, such as SiGe. With the compressive-stressed material, when compressive stress is exerted to the first to third fins F1 to F3 (i.e., channel regions) below the first gate structure 410, the mobility of carriers in the channel regions may be improved.

The first conductive contact 415 may be formed on the first to third fins F1 to F3 and on the substrate 400. The first conductive contact 415 may electrically connect the first to third source/drain regions 411 to 413 with other semiconductor elements (e.g., metal wirings) formed thereon.

Like the semiconductor device according to the previous embodiments of the present disclosure, the bottom width w7 of the first conductive contact 415 may be larger than the top width w6 thereof. Accordingly, it may be possible to prevent bad contact between the first conductive contact 415 and each of the first to third source/drain regions 411 to 413 during the process of forming the first conductive contacts 415, thereby reducing defects in a semiconductor device. As a result, reliability of the semiconductor device may be improved.

The second conductive contact 416 may be formed on the first and second fins F1 and F2 and on the substrate 400. As depicted in FIG. 14, the top width w8 and the bottom width w9 of the second conductive contact 416 may be smaller than the top width w6 and the bottom width w7 of the first conductive contact 415, respectively. However, this is merely illustrative an illustrative example. In some embodiments, the top width w8 and the bottom width w9 of the second conductive contact 416 may be greater than or equal to the top width w6 and the bottom width w7 of the first conductive contact 415, respectively. If the length L2 of the second gate structure 420 in the first (x-axis) direction is equal to or larger than the length L1 of the first gate structure 410 in the first (x-axis) direction, the number of fins that intersect the first and second gate structures 410 and 420 may vary accordingly. Therefore, the top width w8 and the bottom width w9 of the second conductive contact 416 formed on the fins may be equal to or larger than the top width w6 and the bottom width w7 of the first conductive contact 415, respectively.

In FIG. 14, each of the first and second conductive contacts 415 and 416 is formed on the first to third fins F1 to F3 and may be electrically-connected and/or may be single element. However, this is merely an illustrative example. Alternatively, each of the first and second conductive contacts 415 and 416 may be divided into pieces for each of the fins.

The first and second conductive contacts 415 and 416 may be formed using a method for fabricating a semiconductor device to be described below. Namely, the first and second conductive contacts 415 and 416 may be formed by forming a mask pattern on positions where the first and second conductive contacts 415 and 416 are to be formed. This has an advantage in that it enables an operator to form the first and second conductive contacts 415 and 416 accurately on positions as desired.

The interlayer film 430 may be formed on the field insulating film 405 and may cover the first and second gate structures 410 and 420 and the field insulating film 405. In some embodiments of the present disclosure, the interlayer insulating film 430 may include a nitride film. Specifically, the interlayer insulating film 430 may include, but are not limited to, a silicon nitride (SiN) film or silicon oxycarbonitride (SiOCN) film.

Figure 15:
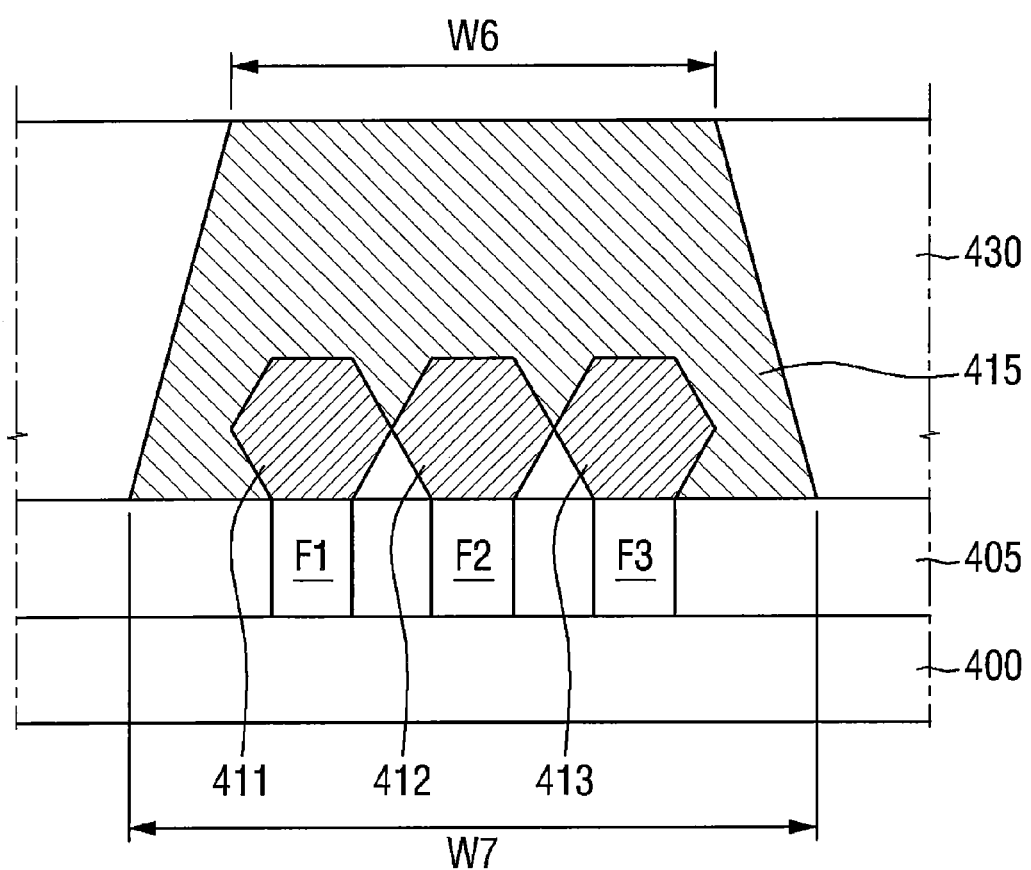
FIG. 15 is a layout view of a semiconductor device according to some embodiments of the present disclosure.

FIG. 15 is a cross-sectional view taken along line A-A of FIG. 13.

Referring to FIG. 15, the bottom width w7 of the first conductive contact 415 may be larger than the top width w6 thereof. Accordingly, it is possible to reduce poor contact between the first conductive contact 415 and one or more of the first to third source/drain regions 411 to 413.

Figure 16:
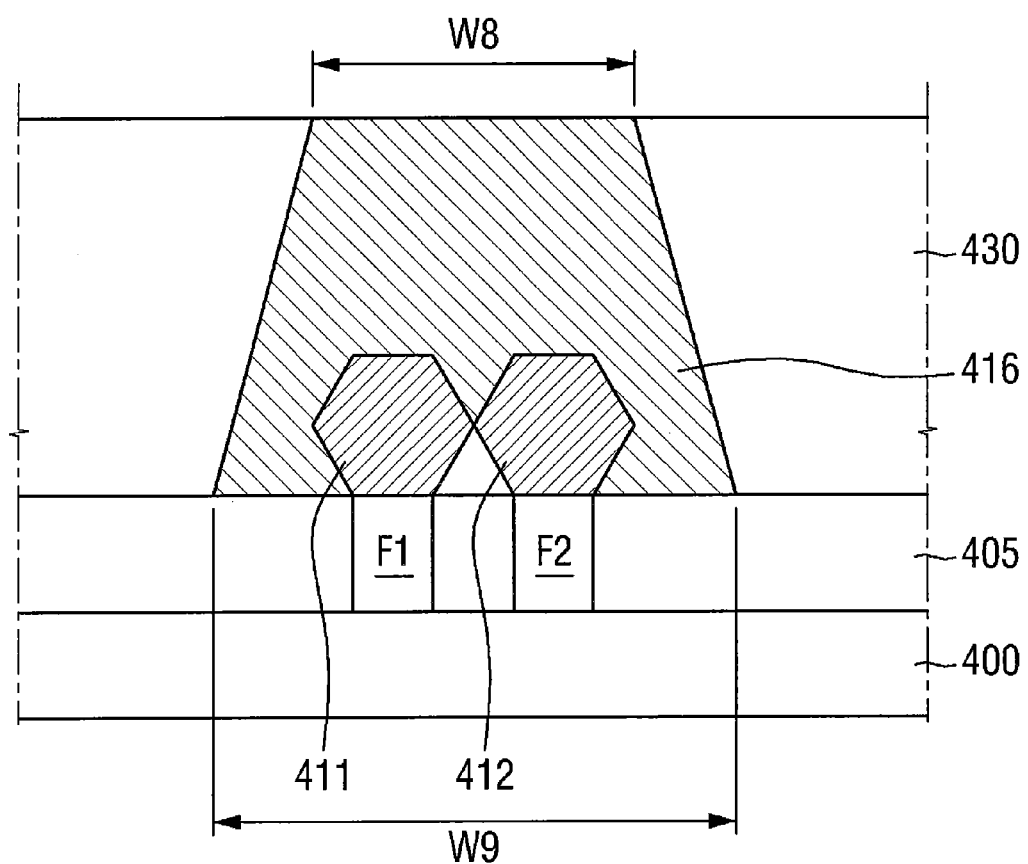
FIGS. 16 to 19 are cross-sectional views for illustrating processes of a method for fabricating a semiconductor device according to some embodiments of the present disclosure.

FIG. 16 is a cross-sectional view taken along line B-B of FIG. 13.

Referring to FIG. 16, the top width w8 and the bottom width w9 of the second conductive contact 416 may be smaller than the top width w6 and the bottom width w7 of the first conductive contact 415, respectively. If the widths of the conductive contacts in the first (x-axis) direction are different from one another, the conductive contacts are formed by using a mask pattern 440 (in FIG. 17) that has different lengths (e.g., in the first (x-axis) direction), as will be described below.

In the following descriptions, a method for fabricating a semiconductor device 4 according to some embodiments of the present disclosure will be described.

Figure 17:
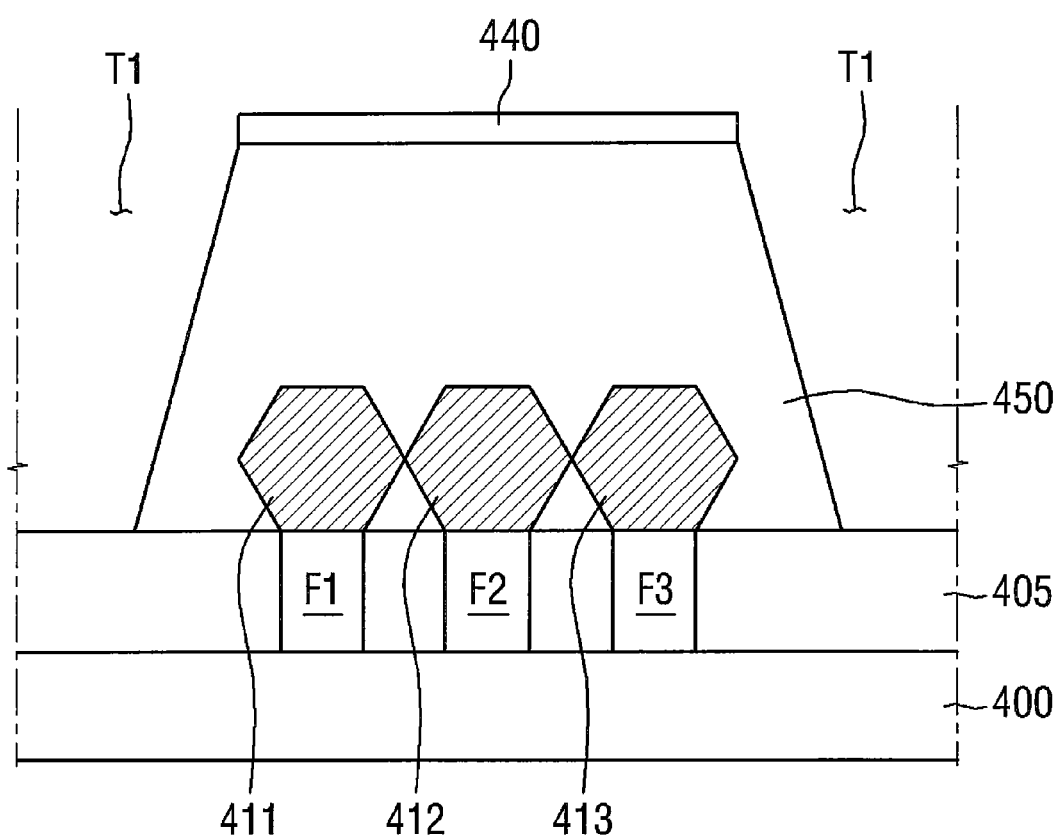
Figure 18:
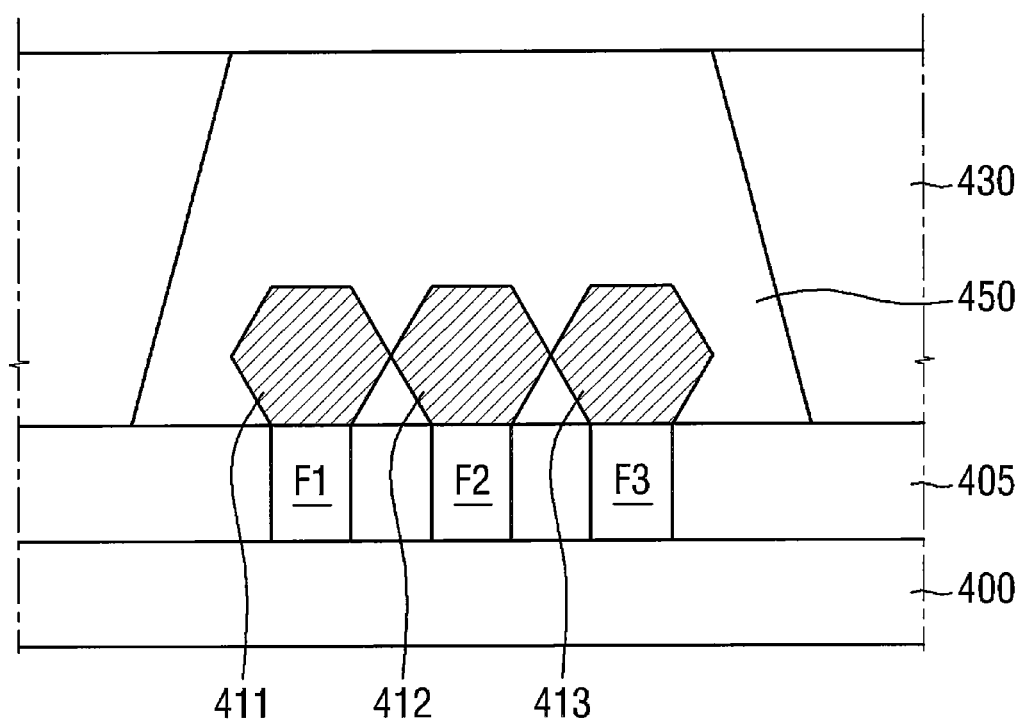
Figure 19:
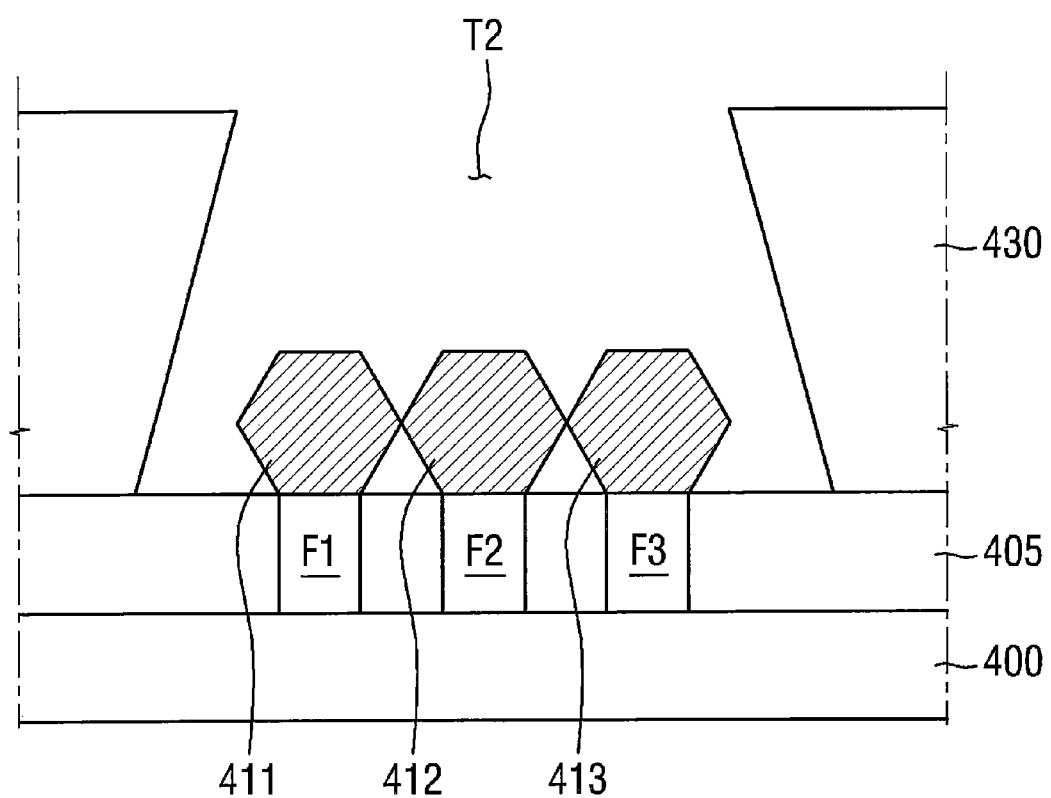

FIGS. 17 to 19 are cross-sectional view for illustrating processes of a method for fabricating a semiconductor device according to some embodiments of the present disclosure.

Referring to FIG. 17, initially, an oxide film 450 may be applied on a field insulating film 405 and over first to third source/drain regions 411 to 413. Then, a mask film pattern 440 may be formed on the oxide film 450 to form first trenches T1 using the mask film pattern 440.

Subsequently, referring to FIG. 18, the first trenches T1 may be filled with an interlayer insulating film 430. Filling the first trenches T1 with the interlayer insulating film 430 may involve filling the first trenches T1 by employing the ALD technique, as discussed above with respect to FIG. 8.

The material for the interlayer insulating film 430 may include a material having higher etch resistance than etch resistance of the oxide film 450. Specifically, the material may include, but is not limited to, a silicon nitride (SiN) film or a silicon oxycarbonitride (SiOCN) film.

Referring to FIG. 19, the oxide film 450 is removed to form second trenches T2. The oxide film 450 may be removed by performing wet etching, for example. In doing so, etch selectivity between the oxide film 450 and the interlayer insulating film 430 may be utilized. Specifically, the oxide film 450 may be removed by using an etchant having etch selectivity of the oxide film 450 relative to the interlayer insulating film 430.

Figure 20:
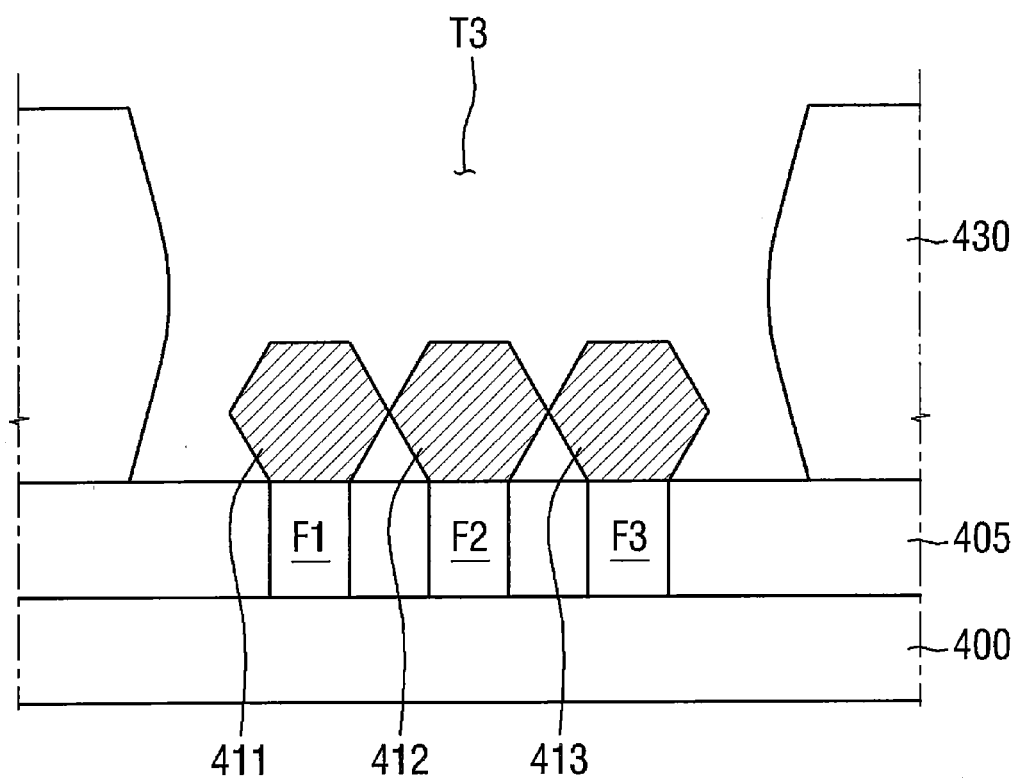
FIG. 20 is a cross-sectional view taken along line A-A of FIG. 13.

FIG. 20 is a view for illustrating a method for fabricating a semiconductor device according to some embodiments of the present disclosure.

Referring to FIG. 20, similar to the method described above with respect to FIG. 12, parts of upper portions of the interlayer insulating film 430 may also be etched during the process of forming third trenches T3. Accordingly, when the third trenches T3 are filled with conductive contacts, the conductive contacts have larger contact area with semiconductor elements (e.g., wirings) thereon. Consequently, electrical connectivity among semiconductor elements may be further improved, and bad contact between the conductive contacts and the first to third source/drain regions 411 to 413 may be prevented.

Figure 21:
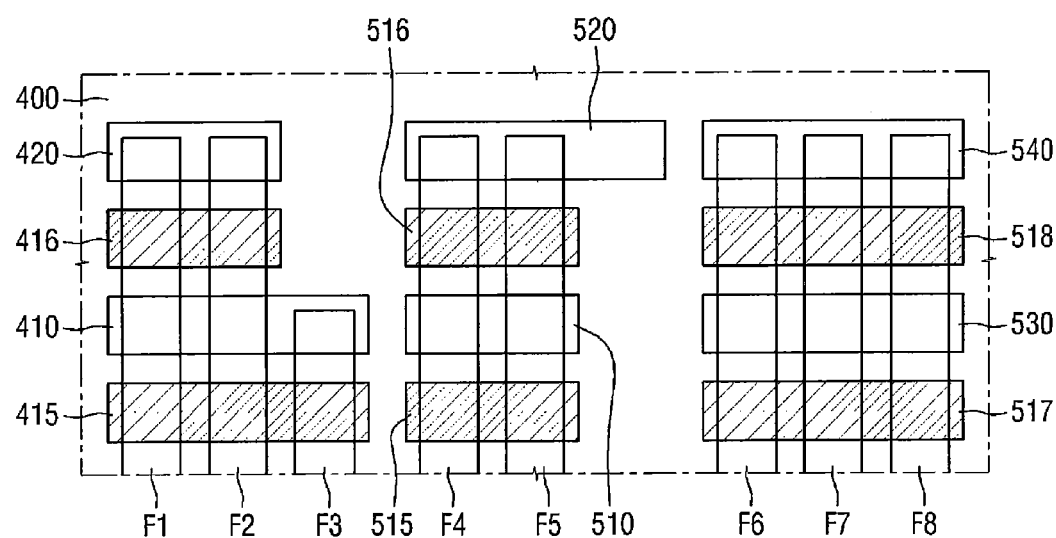
FIG. 21 is a cross-sectional view taken along line B-B of FIG. 13.

FIG. 21 is a layout diagram of a semiconductor device according to some embodiments of the present disclosure.

The semiconductor device may include first to sixth gate structures 410, 420, 510, 520, 530 and 540.

The fourth to eighth fins F4 to F8 may be substantially identical to the first to third fins F1 to F3 described earlier. Accordingly, the fourth to eighth fins F4 to F8 may protrude from the substrate 400.

The first to sixth gate structures 410, 420, 510, 520, 530 and 540 may be deployed in a number of ways depending on design choices of a semiconductor device. For example, the first to sixth gate structures 410, 420, 510, 520, 530 and 540 may be deployed to extend in a direction (e.g., in the first (x-axis) direction in FIG. 15). Further, as shown in FIG. 21, the first to sixth gate structures 410, 420, 510, 520, 530 and 540 may have different lengths in the horizontal direction and may have different number of fins connected thereto.

The third to sixth conductive contacts 515 to 518 may be substantially identical to the first and second conductive contacts 415 and 416. Accordingly, the third to sixth conductive contacts 515 to 518 may be formed on the substrate 400 and on the fourth to eighth fins F4 to F8 formed on the substrate 400.

The first to sixth conductive contacts 415, 416, 515, 516, 517 and 518 may be formed so that they have different lengths in the first (x-axis) direction. The layout shown in FIG. 21 is merely illustrative but is not limiting. Namely, the first to sixth conductive contacts 415, 416, 515, 516, 517 and 518 formed on the fins may have different lengths in the first (x-axis) direction depending on how the gate structures and the fins are connected to one another.

The semiconductor device according to some embodiments may be fabricated using the method for fabricating a semiconductor device according to some embodiments described above. Specifically, a mask pattern may be formed on positions where the first to sixth conductive contacts 415, 416, 515, 516, 517 and 518 are to be formed. By doing so, it is possible to reliably form conductive contacts having various dimensions in the logic region 200 (in FIG. 1) having complicated patterns.

Figure 22:
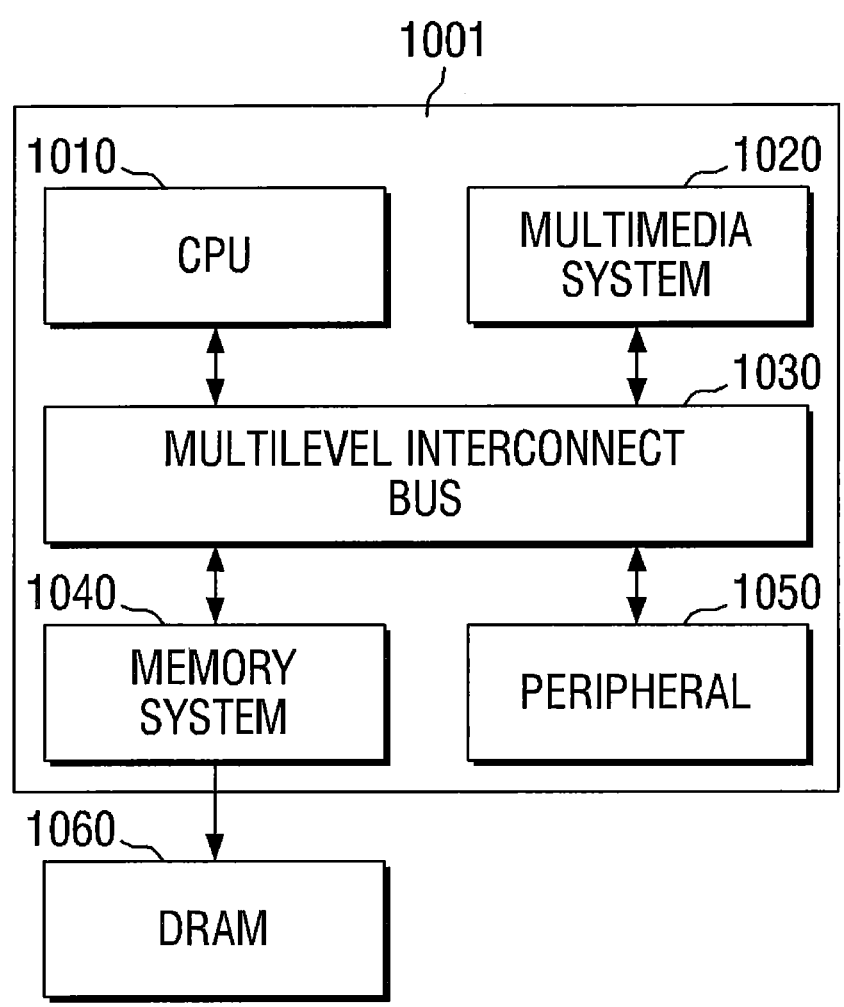
FIG. 22 is a block diagram of a System on Chip (SoC) system including the semiconductor device fabricated using any one of the methods for fabricating a semiconductor device according to embodiments of the present disclosure.

FIG. 22 is a block diagram of a SoC system including the semiconductor device fabricated using any one of the methods for fabricating a semiconductor device according to some embodiments of the present disclosure.

Referring to FIG. 22, the SoC system 1000 includes an application processor 1001 and a DRAM 1060.

The application processor 1001 may include a CPU 1010, a multimedia system 1020, a bus 1030 such as a multilevel interconnect bus, a memory system 1040 and a peripheral 1050.

The CPU 1010 may perform operations necessary for driving the SoC system 1000. In some embodiments of the present disclosure, the CPU 1010 may be configured in a multi-core environment including multiple processors.

The multimedia system 1020 may be used in the SoC system for performing various types of multimedia functions. The multimedia system 1020 may include a 3D engine module, video codec, a display system, a camera system, a post-processor, etc.

The bus 1030 may be used for data communications among the CPU 1010, the multimedia system 1020, the memory system 1040 and the peripheral 1050. In some embodiments of the present disclosure, the bus 1030 may have a multi-layer structure. Specifically, examples of the bus 1030 may include, but are not limited to, a multi-layer AHB (Advanced High-performance Bus) and a multi-layer AXI (Advanced eXtensible Interface), for example.

The memory system 1040 may provide the application processor 1001 with an environment necessary for high speed operation with an external memory (e.g., the DRAM 1060). In some embodiments of the present disclosure, the memory system 1040 may include an additional controller (e.g., a DRAM controller) for controlling an external memory (e.g., the DRAM 1060).

The peripheral 1050 may provide an environment necessary for facilitating the connection between the SoC system 1000 and an external device (e.g., a main board). Accordingly, the peripheral 1050 may have various interfaces that make external devices connected to the SoC system 1000 compatible with the system.

The DRAM 1060 may work as an operational memory necessary for the application processor 1001 to operate. In some embodiments of the present disclosure, the DRAM 1060 may be disposed outside the application processor 1001, as shown in FIG. 22. Specifically, the DRAM 1060 may be packaged with the application processor 1001 as a PoP (Package on Package) assembly.

At least one of the elements of the SoC system 1000 may be fabricated using any one of the above-described methods for fabricating a semiconductor according to embodiments of the present disclosure.

Specifically, the memory system 1040 may correspond to the logic region 300 shown in FIG. 1, and the DRAM 1060 may correspond to the memory cell 200 shown in FIG. 1.

In addition, logic circuits disposed in the DRAM 1060 may correspond to the logic region 300 shown in FIG. 1, and memory cells disposed in the DRAM 1060 may correspond to the memory cell 200 shown in FIG. 1. However, this is merely an illustrative example.

Figure 23:
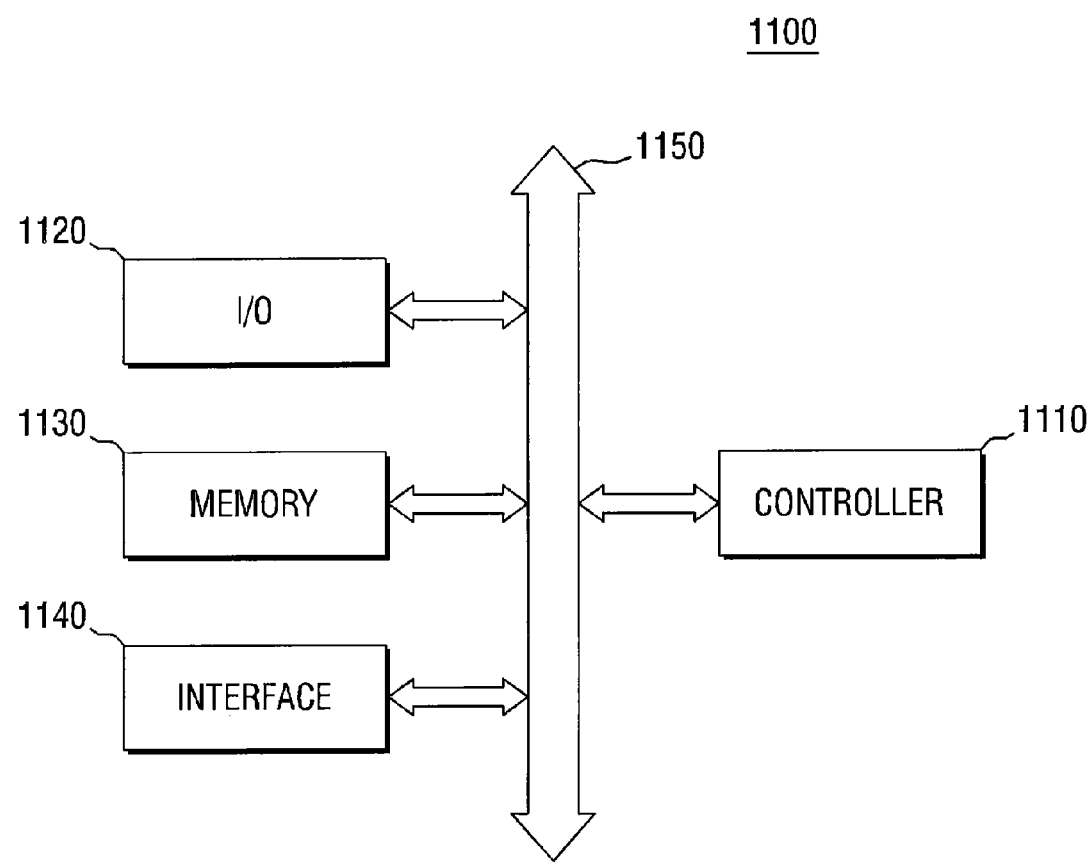
FIG. 23 is a block diagram of an electronic system including the semiconductor device fabricated using any one of the methods for fabricating a semiconductor device according to embodiments of the present disclosure.

FIG. 23 is a block diagram of an electronic system including the semiconductor device fabricated using any one of the methods for fabricating a semiconductor device according to some embodiments of the present disclosure.

Referring to FIG. 23, the electronic system 1100 according to some embodiments of the present disclosure may include a controller 1110, an I/O (input/output) device 1120, a memory device 1130, an interface 1140 and a bus 1150. The controller 1110, the I/O device 1120, the memory device 1130 and/or the interface 1140 may be connected to one another via the bus 1150. The bus 1150 may serve as a path used for data transfer.

The controller 1110 may include at least one of a microprocessor, a digital signal processor, a microcontroller and logic elements capable of performing similar functions. The I/O device 1120 may include a keypad, a keyboard, a display device, etc. The memory device 1130 may store therein data and/or instructions, for example. The interface 1140 may be capable of transmitting/receiving data to/from a communication network. The interface 1140 may be either a wired or wireless interface. For example, the interface 1140 may include an antenna or a wired/wireless transceiver.

Although not shown in FIG. 23, the electronic system 1100 is an operational memory for improving the operation of the controller 1100 and may further include high-speed DRAM and/or SRAM, for example. As the operational memory, the semiconductor device fabricated using any one of the above-described methods for fabricating a semiconductor device according to embodiments of the present disclosure may be employed, thereby improving reliability of the semiconductor device.

Additionally, the semiconductor device fabricated using any one of the above-described methods for fabricating a semiconductor device according to embodiments of the present disclosure may be provided in the memory device 1130 or may be provided as a part of the controller 1110, the I/O device 1120, for example.

The electronic system 1100 may be applied to a PDA (personal digital assistant), a portable computer, a web tablet, a wireless phone, a mobile phone, a digital music player, a memory card, or any electronic device capable of transmitting/receiving information in wireless environment.

Figure 24:
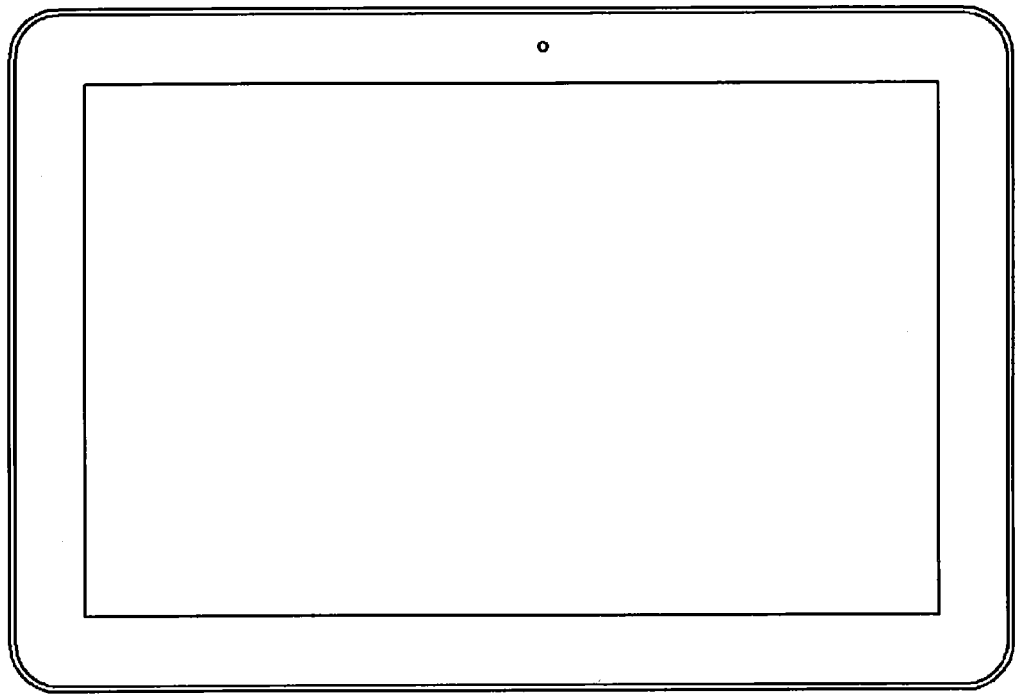
FIGS. 24 to 26 show examples of semiconductor systems that may employ the semiconductor devices fabricated using methods for fabricating a semiconductor device according to embodiments of the present disclosure.
Figure 25:
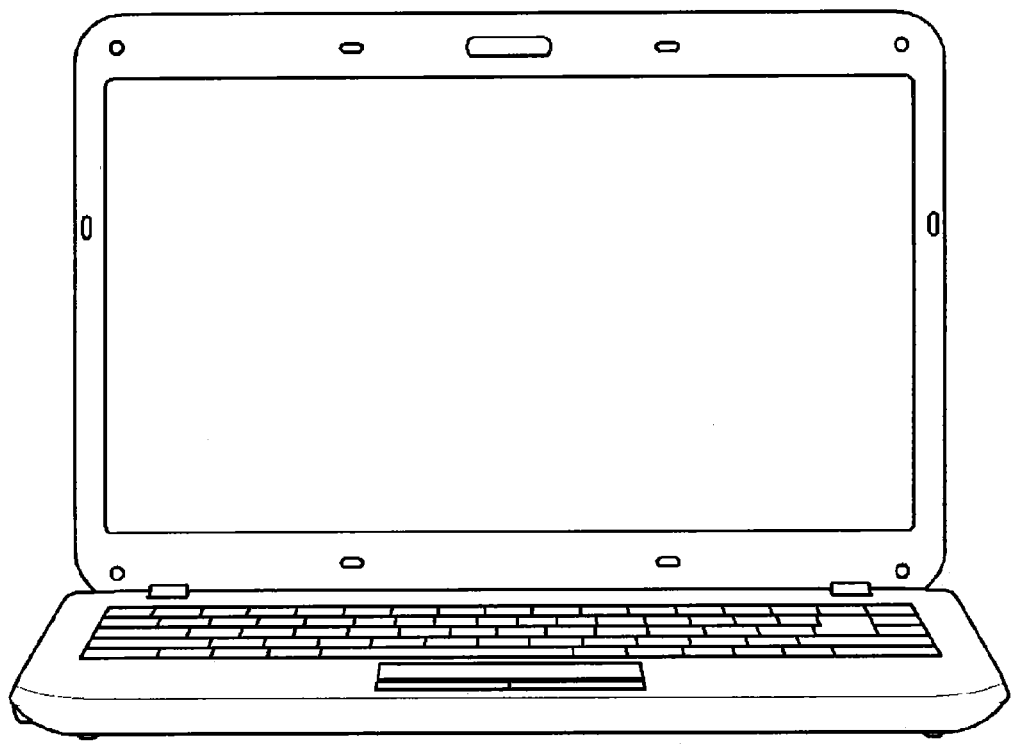
Figure 26:
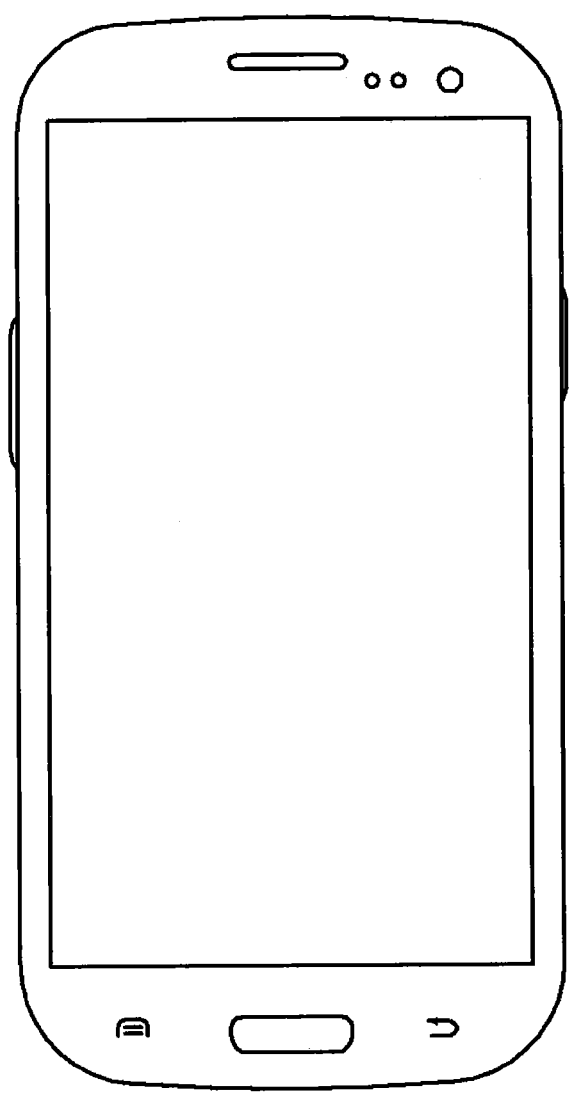

FIGS. 24 to 26 show examples of semiconductor systems that may employ the semiconductor devices fabricated using methods for fabricating a semiconductor device according to embodiments of the present disclosure.

FIG. 24 shows a tablet PC 1200, FIG. 25 shows a laptop computer 1300, and FIG. 26 shows a smartphone 1400. At least one of the semiconductor devices according to some embodiments of the present disclosure may be used by and/or located in the tablet PC 1200, the laptop computer 1300, the smartphone 1400, etc.

As will be appreciated by those skilled in the art, the semiconductor devices fabricated using the methods for fabricating a semiconductor device according to embodiments of the present disclosure may be employed by other integrated circuit devices than those mentioned above.

Namely, in the foregoing descriptions, the tablet PC 1200, the laptop computer 1300 and the smartphone 1400 have been mentioned as examples of the semiconductor system according to some embodiments; however, the examples of the semiconductor system are not limited thereto.

In some embodiments of the present disclosure, the semiconductor system may be implemented as: a computer, UMPC (Ultra Mobile PC), a workstation, a net-book, a PDA (Personal Digital Assistants), a portable computer, a wireless phone, a mobile phone, an e-book, a PMP (portable multimedia player), a portable game console, a navigation device, a digital camera, a 3-dimensional television, a digital audio recorder, a digital audio player, a digital picture recorder, a digital picture player, a digital video recorder, a digital video player, etc.

In the drawings and specification, there have been disclosed typical embodiments and, although specific terms are employed, they are used in a generic and descriptive sense only and not for purposes of limitation, the scope of the disclosure being set forth in the following claims.

What is claimed is:

1. A method for fabricating a semiconductor device, the method comprising:
    forming transistors on a semiconductor substrate, each of the transistors comprising a gate structure and source/drain regions;
    forming an oxide film over the transistors;
    forming a mask film pattern on the oxide film, the mask film pattern comprising a first pattern having a first width and a second pattern having a second width different from the first width;
    removing a first portion of the oxide film using the mask film pattern to form a first trench and a second trench;
    filling the first trench and the second trench with a nitride film;
    removing a second portion of the oxide film to form a third trench and a fourth trench; and
    forming a first conductive contact and a second conductive contact in the third trench and the fourth trench, respectively,
    wherein a top width of the third trench is equal to the first width, and a top width of the fourth trench is equal to the second width.

2. The method of claim 1, wherein a bottom width of the first trench is less than a top width thereof, and a bottom width of the second trench is less than a top width thereof.

3. The method of, claim 2, wherein a bottom width of each of the first and second conductive contacts is greater than a top width thereof.

4. The method of claim 1, wherein the filling the first trench and second trench with the nitride film comprises filling the first trench and the second trench with the nitride film by using an ALD (Atomic Layer Deposition) technique.

5. The method of claim 1, wherein the removing the second portion of the oxide film to form the third trench and the fourth trench comprises removing the oxide film by using a Buffered Oxide Etchant (BOE).

6. The method of claim 5, wherein the BOE comprises HF and $NH_4F$.

7. The method of claim 1,
    wherein the oxide film comprises a silicon oxide ($SiO_2$) film, and
    wherein the nitride film comprises a silicon nitride (SiN) film or a silicon oxycarbonitride (SiOCN) film.

8. The method of claim 1, wherein the semiconductor substrate comprises a first region and a second region, the method further comprising:
    forming a memory cell in the first region,
    wherein the forming the transistors comprises forming the transistors in the second region, and
    wherein the transistors are configured to receive data from the memory cell and/or transmit data to the memory cell.

9. A method for fabricating a semiconductor device, the method comprising:
    forming transistors on a semiconductor substrate, each of the transistors comprising a gate structure and source/drain regions;
    depositing a first insulating film over the transistors;
    forming a mask film pattern on the first insulating film;
    forming a first trench in the first insulating film using the mask film pattern, the first trench having a first bottom width less than a first top width;
    filling the first trench with a second insulating film comprising a different material from the first insulating film;

removing the first insulating film to form a second trench; and forming a conductive contact in the second trench, the conductive contact having a second bottom width greater than a second top width thereof.

10. The method of claim 9, wherein the conductive contact has a middle width less than the bottom width and the top width.

11. The method of claim 9, wherein the removing the first insulating film comprises etching a portion of the upper portion of the second trench along with the first insulating film.

12. The method of claim 9, wherein the first insulating film comprises a silicon oxide ($SiO_2$) film, and the second insulating film comprises a silicon nitride (SiN) film or a silicon oxycarbonitride (SiOCN) film.

13. The method of claim 9, wherein the forming the first trench in the first insulating film comprises forming the first trench in the first insulating film by performing a first isotropic etching on the first insulating film.

14. The method of claim 13, wherein the removing the first insulating film to form the second trench comprises performing a second isotropic etching on the first insulating film using the second insulating film as a mask, to form the second trench.

15. The method of claim 14, wherein the performing the second isotropic etching comprises etching the first insulating film by using a Buffered Oxide Etchant (BOE).

* * * * *